(12) United States Patent
Yamashita et al.

(10) Patent No.: US 8,780,016 B2
(45) Date of Patent: *Jul. 15, 2014

(54) DISPLAY DEVICE, DISPLAY DEVICE DRIVING METHOD, AND ELECTRONIC APPARATUS

(75) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/610,983

(22) Filed: Sep. 12, 2012

(65) Prior Publication Data

US 2013/0002635 A1    Jan. 3, 2013

Related U.S. Application Data

(63) Continuation of application No. 12/081,760, filed on Apr. 21, 2008, now Pat. No. 8,325,109.

(30) Foreign Application Priority Data

May 21, 2007    (JP) .................................. 2007-133862

(51) Int. Cl.
*G09G 3/20*    (2006.01)
*G09G 3/30*    (2006.01)

(52) U.S. Cl.
USPC .............................................. 345/55; 345/77

(58) Field of Classification Search
USPC .............. 345/76–83, 55; 315/169.3; 313/463, 313/504
See application file for complete search history.

(56) References Cited

U.S. PATENT DOCUMENTS

| 5,883,608 | A | 3/1999 | Hashimoto |
| 7,847,762 | B2 * | 12/2010 | Iida et al. .................. 345/76 |
| 8,089,429 | B2 | 1/2012 | Yamashita et al. |
| 2006/0061560 | A1 | 3/2006 | Yamashita et al. |
| 2006/0114200 | A1 | 6/2006 | Yamashita et al. |
| 2006/0170628 | A1 | 8/2006 | Yamashita et al. |

(Continued)

FOREIGN PATENT DOCUMENTS

| JP | 2001-060076 | | 3/2001 |
| JP | 2003-255856 | A | 9/2003 |
| JP | 2003-271095 | A | 9/2003 |
| JP | 2004-029791 | A | 1/2004 |
| JP | 2004-070293 | | 3/2004 |
| JP | 2004-093682 | A | 3/2004 |
| JP | 2004-133240 | A | 4/2004 |
| JP | 2006-215213 | | 8/2006 |

OTHER PUBLICATIONS

Japanese Office Action issued on May 12, 2009 for corresponding Japanese Application No. 2007-133862.

*Primary Examiner* — Jimmy H Nguyen
(74) *Attorney, Agent, or Firm* — Rader, Fishman & Grauer PLLC

(57) ABSTRACT

A display device includes a pixel array portion and a driving portion for driving the pixel array portion. The pixel array portion includes row scanning lines, column signal lines, and pixels arranged in a matrix form at intersections of the scanning lines and the signal lines. The driving portion includes a write scanner for supplying a control signal to each of the scanning lines by sequentially scanning the scanning lines in each field and a signal selector for supplying a video signal to each of the signal lines in synchronization with the sequential scanning. The pixels each includes a storage capacitor, a light-emitting element, a sampling transistor for being turned on in response to the control signal, sampling the video signal, and storing the video signal in the storage capacitor, and a drive transistor for supplying a driving current to the light-emitting element in accordance with the stored video signal.

4 Claims, 17 Drawing Sheets

(56) References Cited

U.S. PATENT DOCUMENTS

| | | |
|---|---|---|
| 2006/0170636 A1 | 8/2006 | Nakamura et al. |
| 2006/0208979 A1 | 9/2006 | Fish et al. |
| 2007/0052644 A1 | 3/2007 | Uchino et al. |
| 2007/0057873 A1 | 3/2007 | Uchino et al. |
| 2007/0268210 A1 | 11/2007 | Uchino et al. |

* cited by examiner

DISPLAY DEVICE, DISPLAY DEVICE DRIVING METHOD, AND ELECTRONIC APPARATUS

CROSS REFERENCES TO RELATED APPLICATIONS

This is a Continuation Application of U.S. patent application Ser. No. 12/081,760, filed Apr. 21, 2008, which in turn claims priority from Japanese Application 2007-133862 filed in the Japan Patent Office on May 21, 2007, the entire contents of which are incorporated herein by reference.

BACKGROUND OF THE INVENTION

1. Field of the Invention

The present invention relates to an active matrix display device for controlling the amount of current passing through a light-emitting element such as an organic EL element using an insulated-gate field-effect transistor included in each pixel, a driving method for the display device, and an electronic apparatus including the display device.

2. Description of the Related Art

In image display devices such as liquid crystal displays, a large number of liquid crystal pixels are arranged in a matrix form. An incident light transmission intensity or an incident light reflection intensity is controlled for each pixel on the basis of information about an image to be displayed so as to display the image. This is similarly performed in organic EL displays in which organic EL elements are used in pixels. In this case, these organic EL elements are self-light-emitting elements that function differently from the above-described liquid crystal pixels. Accordingly, the organic EL displays have the advantages of achieving image visibility and a response speed both of which are higher than those of liquid crystal displays and requiring no backlight. Furthermore, in the organic EL displays, the luminance level (gradation) of each light-emitting element can be controlled in accordance with the value of a current flowing therethrough, that is, each light-emitting element is a so-called current-controlled element. Therefore, the organic EL displays using current-controlled light-emitting elements are significantly different from the liquid crystal displays using voltage-controlled liquid crystal pixels.

Like the liquid crystal displays, the driving methods for the organic EL displays include a simple matrix driving method and an active matrix driving method. The simple matrix driving method can make the structure of an organic EL display simple, but it is difficult to realize a large-sized and high-definition display using such a method. Accordingly, currently, the active matrix driving method is being developed actively. In the active matrix driving method, a current passing through a light-emitting element included in each pixel circuit is controlled by an active element (a thin-film transistor (TFT) is commonly used as an active element) included in the pixel circuit. Japanese Unexamined Patent Application Publication Nos. 2003-255856, 2003-271095, 2004-133240, 2004-029791, 2004-093682, and 2006-215213 describe the active matrix driving method.

SUMMARY OF THE INVENTION

Pixel circuits in the related art are each formed at an intersection of a row scanning line for supplying a control signal and a column signal line for supplying a video signal, and each includes at least a sampling transistor, a storage capacitor, a drive transistor, and a light-emitting element. The sampling transistor is brought into conduction in response to a control signal transmitted from the scanning line, and performs sampling of a video signal transmitted from the signal line. The storage capacitor holds an input voltage in accordance with the sampled video signal. The drive transistor supplies to the light-emitting element an output current in accordance with the input voltage held by the storage capacitor during a predetermined light-emission period. In general, the output current depends on the mobility of carriers in a channel region of the drive transistor and a threshold voltage of the drive transistor. The light-emitting element emits light in accordance with the output current supplied from the drive transistor at a luminance level corresponding to the video signal.

When the input voltage held by the storage capacitor is applied to the gate of the drive transistor, the output current flows between the source and the drain of the drive transistor, thereby energizing the light-emitting element. In general, the luminance level of light emitted from the light-emitting element is proportional to the amount of current flowing therethrough. The amount of output current supplied from the drive transistor is controlled in accordance with the gate voltage of the drive transistor, that is, the input voltage stored in the storage capacitor. Pixel circuits in the related art control the amount of current supplied to the light-emitting element by changing the input voltage applied to the gate of the drive transistor in accordance with the input video signal.

The drive transistor has an operating characteristic expressed by the following equation 1.

$$Ids = (1/2)\mu(W/L)Cox(Vgs-Vth)^2 \qquad \text{Equation 1}$$

where Ids denotes a drain current flowing between the source and the drain of the drive transistor, that is, the output current supplied to the light-emitting element in the pixel circuit, Vgs denotes a gate voltage that is applied to the gate with respect to the source, that is, the above-described input voltage in the pixel circuit, Vth denotes the threshold voltage of the transistor, μ denotes the mobility of a semiconductor thin film functioning as the channel of the transistor, W denotes a channel width, L denotes a channel length, and Cox denotes a gate capacitance. As is apparent from the transistor characteristic equation 1, when the thin-film transistor operates in a saturated region, if the gate voltage Vgs exceeds the threshold voltage Vth, the thin-film transistor is turned on and then the drain current Ids flows. From the principle point of view, as indicated by the transistor characteristic equation 1, if the gate voltage Vgs is constant, the amount of the drain current Ids supplied to the light-emitting element remains constant. Accordingly, if video signals of the same level are individually supplied to pixels forming a display screen, all the pixels emit light at the same luminance level. As a result, uniformity of the display screen can be obtained.

In reality, however, there are variations among the thin-film transistors (TFTs) made of a semiconductor film such as polysilicon in terms of device characteristics. For example, the threshold voltage Vth varies from device to device. As is apparent from the transistor characteristic equation 1, if the threshold voltage Vth of the drive transistor varies, the drain current Ids also varies even under the condition in which the gate voltage Vgs is constant. Therefore, the luminance level also varies from pixel to pixel. This causes the lack of uniformity of the display screen. In order to overcome this difficulty, pixel circuits having a function of canceling the variations in the threshold voltage of the drive transistor (threshold voltage correction function) have been developed as disclosed in, for example, Japanese Unexamined Patent Application Publication No. 2004-133240.

Furthermore, not only the threshold value Vth but also the mobility μ varies from device to device. As is apparent from the transistor characteristic equation 1, if the mobility μ varies, the drain current Ids varies even under the condition in which the gate voltage Vgs is constant. Therefore, the luminance level varies from pixel to pixel. This causes the lack of uniformity of the display screen. In order to overcome this difficulty, pixel circuits having a function of canceling the variations in the mobility of the drive transistor (mobility correction function) have been developed as disclosed in, for example, Japanese Unexamined Patent Application Publication No. 2006-215213.

Pixel circuits in the related art operate in a light-emission period and a non-light-emission period in each field. In the non-light-emission period, the above-described processing for correcting the threshold value of each drive transistor and the above-described processing for correcting mobility of each drive transistor are performed.

Pixel circuits in the related art each has a switching transistor for switching between the light-emission period and the non-light-emission period in each field in addition to the sampling transistor and the drive transistor. By alternately turning on and off the switching transistor, a light-emission state and a non-light-emission state are switched in each pixel.

In order to drive a pixel array portion in which pixels each having the above-described configuration are arranged in a matrix form, a peripheral driving portion around the pixel array portion requires a write scanner for performing sequential row scanning of the sampling transistors and another scanner for switching between the light-emission period and the non-light-emission period by alternately turning on and off each switching transistor.

An active matrix display device in the related art is configured with a single panel. In the center part of the panel, a pixel array portion corresponding to a display screen is disposed. In a peripheral part around the display screen, a drive circuit is disposed. The peripheral part of the panel is also called a frame portion, since the peripheral part enclosing the display screen in the center part of the panel looks like a frame. With increasing number of scanners required in the drive circuit, the area of the frame portion increases. The increase in size of the frame portion imposes various limitations on the center part for the display screen. For example, the flexibility in the shape and design of a set product decreases. Thus, the increase in size of the frame portion imposes limitations on the design of a set product. The increase in the area of the frame portion due to the increase in complexity of the peripheral drive circuit is a difficulty to be solved.

It is desirable to reduce the area of a frame portion by reducing the number of scanners included in a peripheral driving portion (hereinafter also referred to as miniaturization of a frame).

A display device according to an embodiment of the present invention includes a pixel array portion and a driving portion configured to drive the pixel array portion. The pixel array portion includes row scanning lines, column signal lines, and pixels arranged in a matrix form at intersections of the row scanning lines and the column signal lines. The driving portion includes at least a write scanner configured to supply a control signal to each of the row scanning lines by sequentially scanning the row scanning lines in each field and a signal selector configured to supply a video signal to each of the column signal lines in synchronization with the sequential row scanning. The pixels each includes a storage capacitor, a light-emitting element, a sampling transistor that has a control terminal and a pair of current terminals and is configured to be turned on in response to the control signal, sample the video signal, and store the sampled video signal in the storage capacitor, and a drive transistor that has a control terminal and a pair of current terminals and is configured to supply a driving current to the light-emitting element in accordance with the video signal stored in the storage capacitor. The control terminal of the sampling transistor is connected to one of the row scanning lines. One of the current terminals of the sampling transistor is connected to one of the column signal lines, and the other one of the current terminals of the sampling transistor is connected to the control terminal of the drive transistor. One of the current terminals of the drive transistor is connected to a power supply, and the other one of the current terminals of the drive transistor is connected to the light-emitting element. The storage capacitor is connected to the control terminal of the drive transistor. Each of the pixels operates in a light-emission period and a non-light-emission period in each field and performs in the non-light-emission period processing for correcting a threshold voltage of the drive transistor, processing for storing the video signal in the storage capacitor, and processing for correcting mobility of the drive transistor. The signal selector supplies not only the video signal but also a predetermined potential to each of the column signal lines so as to turn off the light-emitting element. The write scanner supplies the control signal to each of the row scanning lines such that not only the video signal but also the predetermined potential is supplied from the column signal lines to the pixels. The sampling transistor obtains the predetermined potential from one of the column signal lines in response to the control signal supplied from the write scanner and applies the obtained predetermined potential to the control terminal of the drive transistor so as to turn off the light-emitting element and switch from the light-emission period to the non-light emission period.

The storage capacitor is connected between the control terminal of the drive transistor and the other one of the current terminals of the drive transistor in each of the pixels. Each of the pixels performs the processing for correcting a threshold voltage of the drive transistor by passing a current to the drive transistor until the drive transistor is cut off before the video signal is sampled, obtaining a voltage between the control terminal of the drive transistor and the other one of the current terminals of the drive transistor when the drive transistor is cut off, and storing the obtained voltage in the storage capacitor. Furthermore, each of the pixels performs the processing for correcting mobility of the drive transistor by negatively feeding back the driving current flowing through the driving transistor to the storage capacitor for a predetermined correction period when the sampling transistor is turned on and the video signal is stored in the storage capacitor.

According to an embodiment of the present invention, the write scanner supplies to each scanning line not only a control signal used to supply a video signal from the signal line to a pixel but also a control signal used to supply a predetermined potential from the signal line to the pixel. The sampling transistor obtains the predetermined potential from the signal line in response to the control signal supplied from the write scanner and cuts off the drive transistor, thereby turning off the light-emitting element and switching from the light-emission period to the non-light-emission period. In the above-described configuration, each pixel requires no switching transistor for switching between the light-emission period and the non-light-emission period, and the driving portion requires no scanner for sequentially scanning the switching transistors. Consequently, the miniaturization of the frame of a panel can be achieved.

DESCRIPTION OF THE PREFERRED EMBODIMENTS

Figure 1:
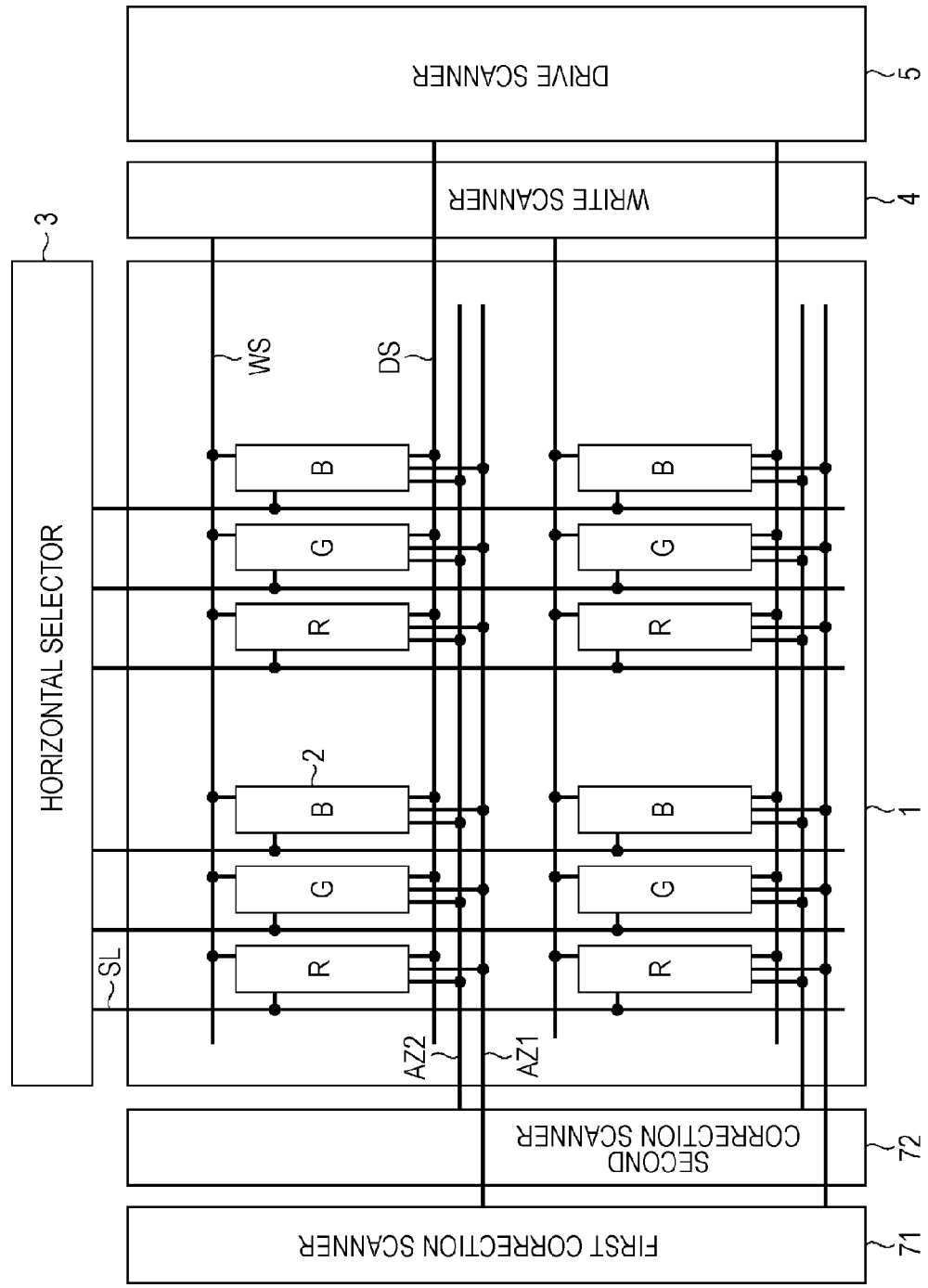
FIG. 1 is a block diagram illustrating an entire configuration of an exemplary display device.

Embodiments of the present invention will be described in detail below with reference to the accompanying drawings. First, in order to clarify the background of the present invention, an example of an active matrix display device will be described with reference to FIG. 1. As illustrated in the drawing, an active matrix display device includes a pixel array 1 serving as a main portion and a peripheral circuit portion. The peripheral circuit portion includes a horizontal selector 3, a write scanner 4, a drive scanner 5, a first correction scanner 71, and a second correction scanner 72. The pixel array 1 has R, G, and B pixels which are arranged in a matrix form and each of which is disposed at an intersection of one of row scanning lines WS and one of column signal lines SL. Although the R, G and B pixels of three primary colors of red, green, and blue are used to enable a color display, an embodiment of the present invention is not limited thereto. Each of the R, G and B pixels is formed of a pixel circuit 2. The horizontal selector 3 drives the signal lines SL. The horizontal selector 3 is a signal portion for providing a video signal to the signal lines SL. The write scanner 4 drives the scanning lines WS. In addition to the scanning lines WS, scanning lines DS, AZ1 and AZ2 are provided. The drive scanner 5, the first correction scanner 71, and the second correction scanner 72 drive the scanning lines DS, the scanning lines AZ1, and the scanning lines AZ2, respectively. The write scanner 4, the drive scanner 5, the first correction scanner 71, and the second correction scanner 72 form a scanner portion for sequentially scanning rows of pixels in every horizontal scanning period. Since this example includes a total of four scanners, the area of the frame portion is large. This interferes with the miniaturization of the frame portion. When the pixel circuit 2 is selected by the scanning line WS, the pixel circuit 2 performs sampling of the video signal supplied from the signal line SL. When the pixel circuit 2 is selected by the scanning line DS, a light-emitting element included in the pixel circuit 2 is driven in accordance with the sampled video signal. That is, the drive scanner 5 for supplying a control signal to the scanning lines DS switches between a light-emission period and a non-light-emission period in a pixel. When the pixel circuit 2 is scanned by the scanning lines AZ1 and AZ2, correction operations determined in advance are performed.

The pixel array 1 is typically formed on an insulating substrate such as a glass substrate to form a flat panel. Each of the pixel circuits 2 is formed of low-temperature polysilicon TFTs. In the case the pixel array 1 including pixel circuits 2 each formed of the low-temperature polysilicon TFTs, the pixel array 1, the signal portion, and the scanner portion can integrally be formed on the same flat panel. The reason for this is that both of the signal portion and the scanner portion can also be formed of low-temperature polysilicon TFTs. The signal portion and the scanner portion form a peripheral driving portion.

Figure 2:
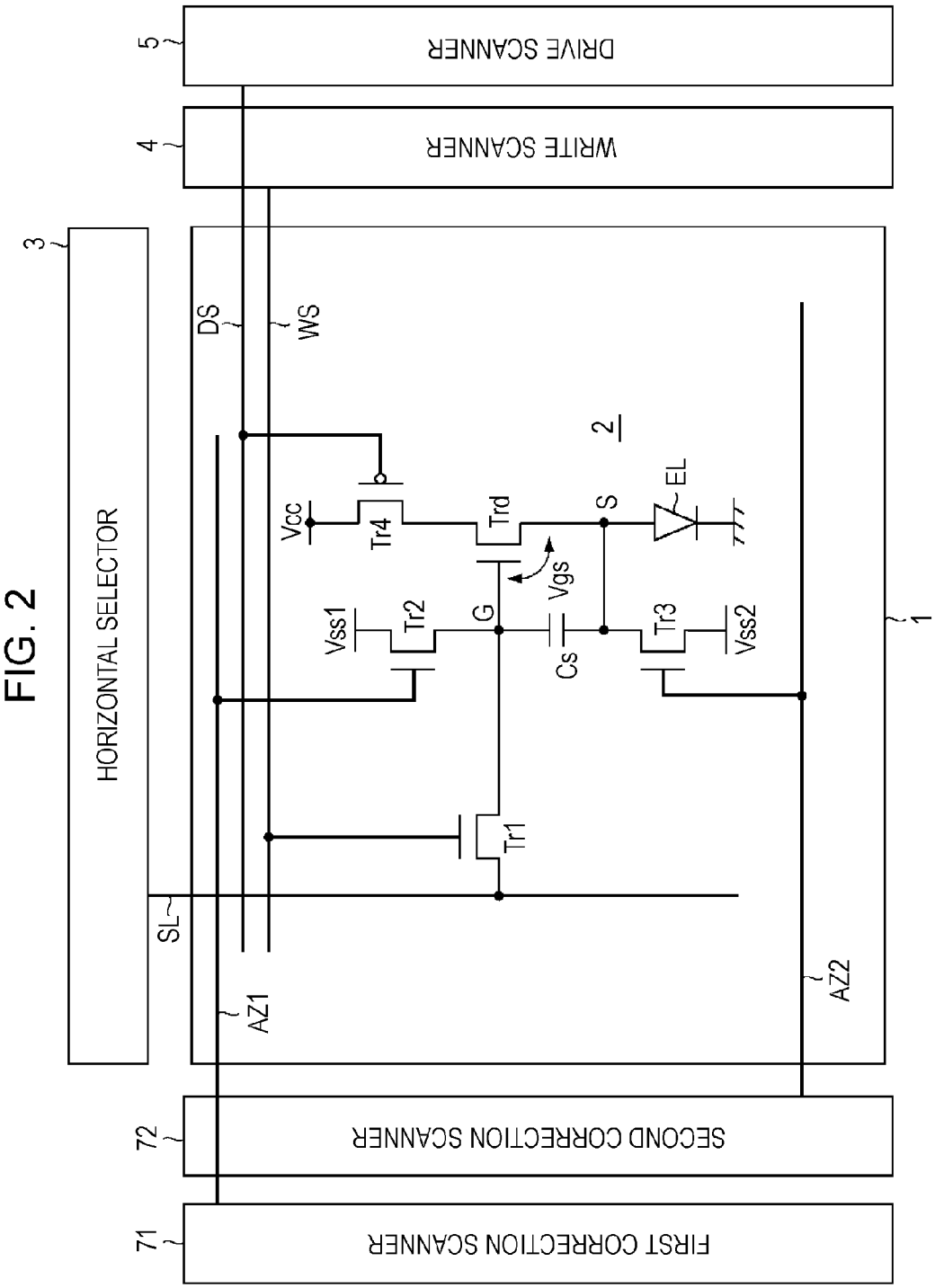
FIG. 2 is a circuit diagram illustrating an exemplary configuration of a pixel included in the exemplary display device illustrated in FIG. 1.

FIG. 2 is a circuit diagram illustrating a configuration of each of pixels included in the exemplary display device illustrated in FIG. 1. The pixel circuit 2 has five thin-film transistors, i.e., transistors Tr1 to Tr4 and a transistor Trd, a single capacitive element (storage capacitor) Cs, and a single light-emitting element EL. Each of the transistors Tr1 to Tr3 and the transistor Trd is an N-channel polysilicon TFT. Only the transistor Tr4 is a P-channel polysilicon TFT. The capacitive element Cs forms a capacitor portion of the pixel circuit 2. For example, the light-emitting element EL is a diode organic EL element having an anode and a cathode.

The drive transistor Trd, which is a central component of the pixel circuit 2, has a gate G connected to one end of the storage capacitor Cs and a source S connected to the other end of the storage capacitor Cs. The gate G of the drive transistor Trd is also connected to a reference potential Vss1 via the switching transistor Tr2. The drain of the drive transistor Trd is connected to a power supply Vcc via the switching transistor Tr4. The gate of the switching transistor Tr2 is connected to the scanning line AZ1. The gate of the switching transistor Tr4 is connected to the scanning line DS. The anode of the light-emitting element EL is connected to the source S of the drive transistor Trd and the cathode of the light-emitting element EL is connected to the ground. In some cases, the potential of the ground is represented by Vcath. The switching transistor Tr3 is connected between the source S of the drive transistor Trd and another reference potential Vss2. The gate of the switching transistor Tr3 is connected to the scanning line AZ2. The sampling transistor Tr1 is connected between the signal line SL and the gate G of the drive transistor Trd. The gate of the sampling transistor Tr1 is connected to the scanning line WS.

In the above-described configuration, the sampling transistor Tr1 is brought into conduction in response to a control signal WS supplied from the scanning line WS in a predetermined sampling period, samples a video signal Vsig supplied from the signal line SL, and stores the sampled video signal Vsig in the storage capacitor Cs. In accordance with the sampled video signal Vsig, the storage capacitor Cs applies an input voltage Vgs between the gate G and the source S of the drive transistor Trd. During a predetermined light-emission period, the drive transistor Trd supplies an output current (drain current) Ids to the light-emitting element EL in accordance with the input voltage Vgs. The output current Ids depends on mobility $\mu$ of carriers in a channel region of the drive transistor Trd and a threshold voltage Vth of the drive transistor Trd. The light-emitting element EL emits light at a luminance level corresponding to the video signal Vsig in accordance with the output current Ids supplied from the transistor Trd.

The pixel circuit 2 includes a correction portion formed of the switching transistors Tr2 to Tr4. In order to cancel the dependence of the output current Ids on the mobility $\mu$ of carriers in a channel region of the drive transistor Trd, the input voltage Vgs held in the storage capacitor Cs is corrected in advance at the beginning of the light-emission period. More specifically, in response to the control signals WS and DS that are supplied from the scanning lines WS and DS, respectively, the correction portion (the switching transistors Tr2 to Tr4) operates during a part of the sampling period so as to correct the input voltage Vgs by extracting the output current Ids from the drive transistor Trd while the video signal Vsig is sampled and negatively feeding back the extracted output current Ids to the storage capacitor Cs. In addition, in order to cancel the dependence of the output current Ids on the threshold voltage Vth of the drive transistor Trd, the correction portion (the switching transistors Tr2 to Tr4) detects the threshold voltage Vth of the drive transistor Trd prior to the sampling period and adds the detected threshold voltage Vth to the input voltage Vgs.

The drive transistor Trd, which is an N-channel transistor, has the drain connected to the power supply Vcc and the source S connected to the light-emitting device EL. In this case, at the beginning of the light-emission period overlapping with the later part of the sampling period preceding the light-emission period, the above-described correction portion extracts the output current Ids from the drive transistor Trd and negatively feeds back the extracted output current Ids to the storage capacitor Cs. At that time, the correction portion causes the output current Ids extracted from the source S of the drive transistor Trd at the beginning of the light-emission period to flow to a capacitor included in the light-emitting element. More specifically, the light-emitting element EL is a diode light-emitting element having an anode connected to the source S of the drive transistor Trd and a cathode connected to the ground. In this configuration, the correction portion (the switching transistors Tr2 to Tr4) sets in advance the anode and the cathode of the light-emitting element EL to be in a reverse biased state so as to cause the diode light-emitting element to serve as a capacitive element when the output current Ids extracted from the source S of the drive transistor Trd flows to the light-emitting element EL. The correction portion can adjust a time width t of a period during which the output current Ids is extracted from the drive transistor Trd within the sampling period, thereby optimizing the amount of negative feedback of the output current Ids to the storage capacitor Cs.

Figure 3:
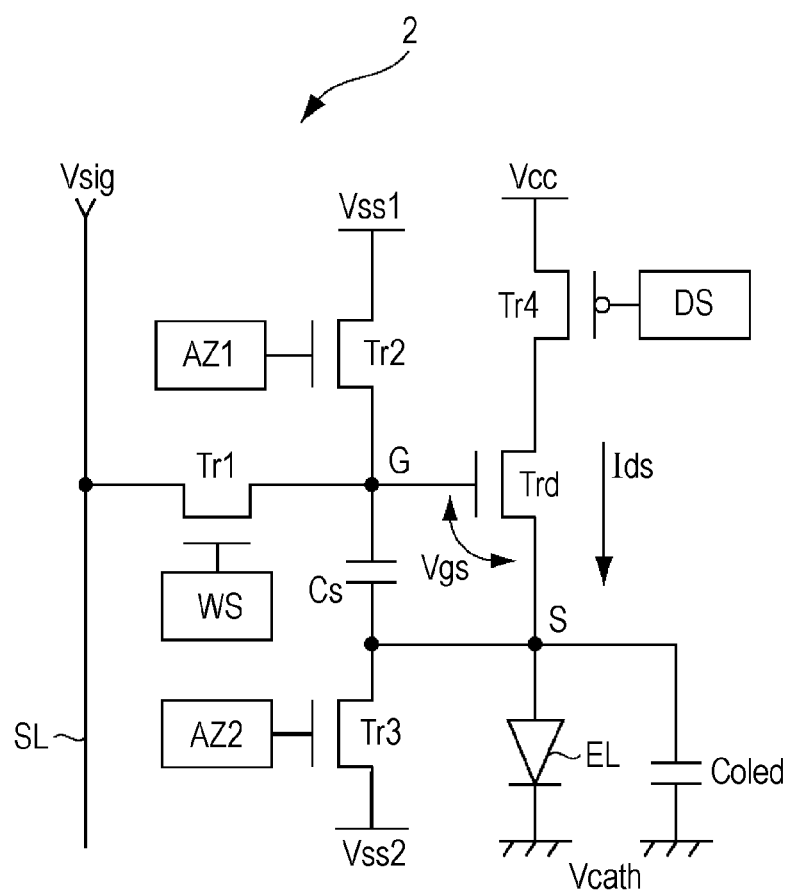
FIG. 3 is a circuit diagram used to describe an operation of the pixel illustrated in FIG. 2.

FIG. 3 is a schematic diagram of a pixel circuit included in the display device illustrated in FIG. 2. In order to make the operation of a pixel circuit more easily understandable, the video signal Vsig to be sampled by the sampling transistor Tr1, the input voltage Vgs of the drive transistor Trd, the output current Ids of the drive transistor Trd, and a capacitive component Coled of the light-emitting element EL are added. A basic operation performed by the pixel circuit 2 will be described below with reference to FIG. 3.

Figure 4:
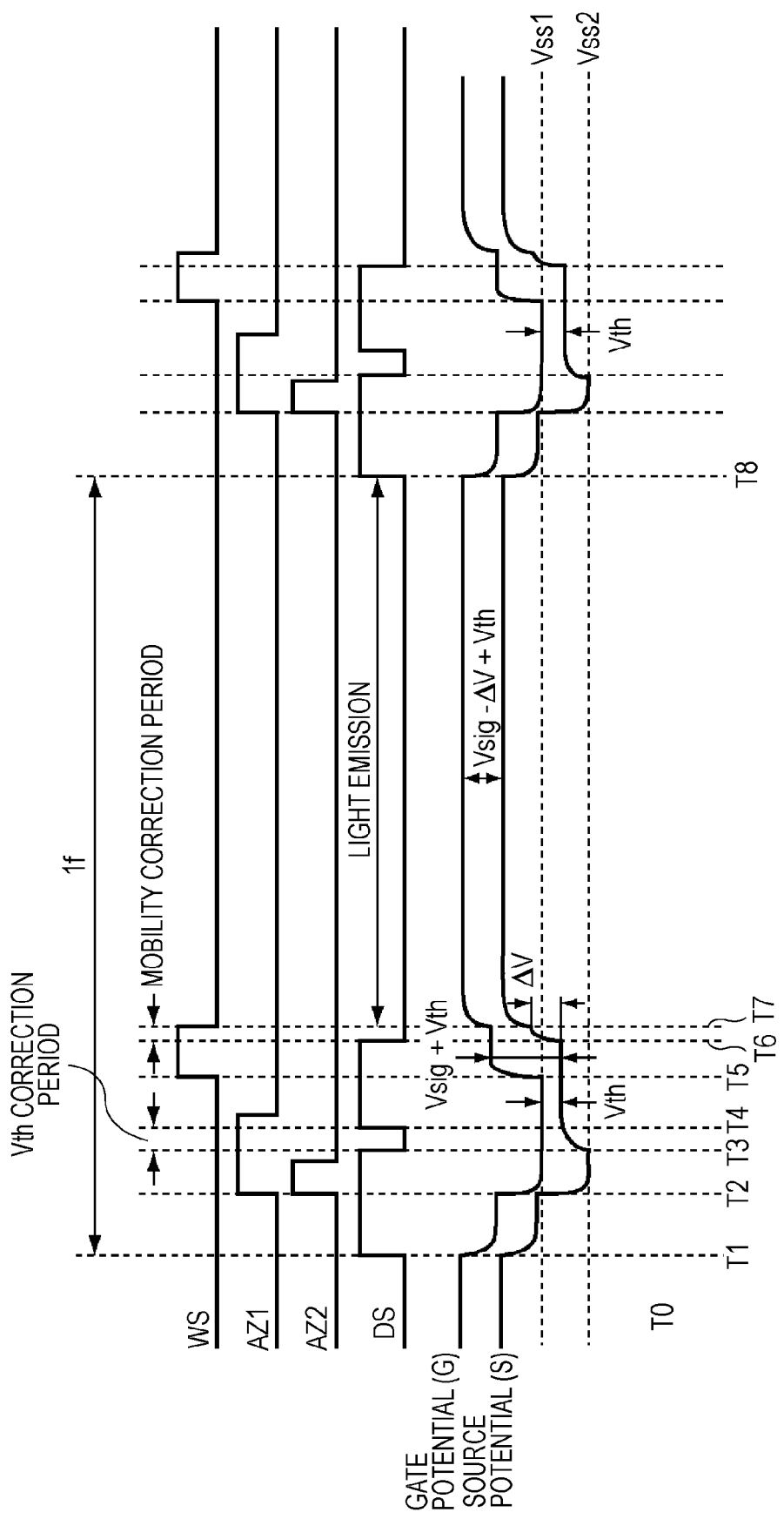
FIG. 4 is a timing chart used to describe an operation of an exemplary display device.

FIG. 4 is a timing chart of the pixel circuit illustrated in FIG. 3. The operation of the pixel circuit illustrated in FIG. 3 will be described in detail with reference to FIG. 4. FIG. 4 illustrates along a time axis T the waveforms of control signals applied to the scanning lines WS, AZ1, AZ2, and DS. For the sake of simplification of the drawing, each control signal is represented by the same symbol as that of the corresponding scanning line. Since the transistors Tr1, Tr2 and Tr3 are N-channel transistors, they are turned on when the signal level of control signals passing through the scanning lines WS, AZ1, and AZ2 is a high level, and are turned off when the signal level of the control signals passing through the scanning lines WS, AZ1, and AZ2 is a low level. On the other hand, since the transistor Tr4 is a P-channel transistor, the transistor Tr4 is turned off when the signal level of a control signal passing through the scanning lines DS is the high level and is turned on when the signal level of the control signal passing through the scanning lines DS is the low level. In this timing chart, not only the waveforms of the control signals WS, AZ1, AZ2, and DS but also potential changes at the gate G and the source S of the drive transistor Trd are illustrated.

In the timing chart illustrated in FIG. 4, the period from a time T1 to a time T8 is defined as one field (1f). In one field, rows included in the pixel array are sequentially scanned once. The timing chart illustrates the waveforms of the control signals WS, AZ1, AZ2, and DS applied to pixels on a single row.

At a time T0, which is prior to the start of a certain field, the signal levels of all the control signals WS, AZ1, AZ2, and DS are the low level. Accordingly, the N-channel transistors Tr1, Tr2, and Tr3 are in an off state, and only the P-channel transistor Tr4 is in an on state. Since the drive transistor Trd is connected to the power supply Vcc via the transistor Tr4 that is in the on state, the drive transistor Trd supplies the output current Ids to the light-emitting element EL in accordance with the certain input voltage Vgs. Accordingly, the light-emitting element EL emits light at the time T0. The input voltage Vgs applied at this time to the drive transistor Trd is expressed as the potential difference between the gate potential (G) and the source potential (S).

At a time T1 at which the field is started, the signal level of the control signal DS is changed from the low level to the high level, so that the transistor Tr4 is turned off and the drive transistor Trd is disconnected from the power supply Vcc. As a result, light emission is terminated, and a non-light-emission period is started. That is, at the time T1, all the transistors Tr1 to Tr4 are in the off state.

Subsequently, at a time T2, the signal level of each of the control signals AZ1 and AZ2 is changed to the high level, so that the switching transistors Tr2 and Tr3 are turned on. As a result, the gate G of the drive transistor Trd is connected to the reference potential Vss1, and the source S thereof is connected to the reference potential Vss2. Here, the inequality Vss1−Vss2>Vth is satisfied. Therefore, by setting the inequality Vss1−Vss2=Vgs>Vth, a preparation for correction of the threshold voltage to be performed at a time T3 is made. That is, the period from the time T2 to the time T3 corresponds to a reset period for the drive transistor Trd. Furthermore, the inequality VthEL>Vss2 is satisfied in which VthEL denotes the threshold voltage of the light-emitting element EL. Accordingly, a negative bias is applied to the light-emitting element EL, and the light-emitting element EL is in the so-called reverse biased state. This reverse biased state is required so as to normally perform the correction of the threshold voltage Vth and the mobility correction later.

At the time T3, the signal level of the control signal AZ2 is changed to the low level. Immediately after that, the signal level of the control signal DS is also changed to the low level. As a result, the transistor Tr3 is turned off, and the transistor Tr4 is turned on. The drain current Ids therefore flows to the storage capacitor Cs, so that the correction of the threshold voltage Vth is started. At that time, the gate G of the drive transistor Trd is still connected to the reference potential Vss1. Accordingly, the current Ids flows until the drive transistor Trd is cut off. When the drive transistor Trd is cut off, the source potential (S) of the drive transistor Trd becomes equal to the difference of Vss1−Vth. At a time T4 after the cut-off of the drain current, the signal level of the control signal DS is changed back to the high level again to turn off the switching transistor Tr4. In addition, the signal level of the control signal AZ1 is changed back to the low level to turn off the switching transistor Tr2. As a result, the threshold voltage Vth is held in the storage capacitor Cs. Thus, the period from the time T3 to the time T4 is a period of detecting the threshold voltage Vth for the drive transistor Trd. The detection period from the time T3 to the time T4 is referred to as a Vth correction period.

At a time T5 after the Vth correction has been performed as described above, the signal level of the control signal WS is changed to the high level so as to turn on the sampling transistor Tr1. As a result, the video signal Vsig is stored in the storage capacitor Cs. The capacitance of the storage capacitor Cs is much smaller than an equivalent capacitance Coled of the light-emitting element EL. Accordingly, most of the video signal Vsig is stored in the storage capacitor Cs. More accurately, the potential difference Vsig−Vss1 is stored in the storage capacitor Cs. Therefore, the input voltage Vgs applied between the gate G and the source S of the drive transistor Trd becomes equal to the sum of the threshold voltage Vth detected and held earlier and the potential difference of (Vsig−Vss1) sampled this time, that is, becomes equal to (Vsig−Vss1+Vth). In order to simplify the following description, it is assumed that the reference potential Vss1 is zero volt. In this case, the input voltage Vgs applied between the gate and the source is equal to the sum of (Vsig+Vth) as illustrated in the timing chart in FIG. 4. The sampling of the video signal Vsig is performed until a time T7 at which the signal level of the control signal WS is changed back to the low level. That is, the period from the time T5 to the time T7 is a sampling period.

At a time T6 preceding the time T7 at which the sampling period ends, the signal level of the control signal DS is changed to the low level so as to turn on the switching transistor Tr4. As a result, the drive transistor Trd is connected to the power supply Vcc. In the pixel circuit, the non-light-emission period is therefore switched to the light-emission period. During the period from the time T6 to the time T7 in which the sampling transistor Tr1 is still in the on state and the switching transistor Tr4 is in the on state, the mobility correction is performed for the drive transistor Trd. That is, in this example, the mobility correction is performed during the period from the time T6 to the time T7 in which the later part of the sampling period overlaps with the beginning of the light-emission period. At the beginning of the light-emission period at which the mobility correction is performed, in reality, the light-emitting element EL is in the reverse biased state and therefore emits no light. In the mobility correction period from the time T6 to the time T7, the drain current Ids flows through the drive transistor Trd while the gate G of the drive transistor Trd is fixed at the level of the video signal Vsig. If the inequality Vss1−Vth<VthEL is set, the light-emitting element EL is in the reverse biased state. Accordingly, the light-emitting element EL exhibits a simple capacitive characteristic instead of a diode characteristic. The output current Ids flowing through the drive transistor Trd is therefore stored in a combined capacitor having a capacitance C obtained by combining the capacitance of the storage capacitor Cs and the equivalent capacitance Coled of the light-emitting element EL (C=Cs+Coled). This increases the source potential (S) of the drive transistor Trd. The increase in the source potential (S) is represented by ΔV in the timing chart illustrated in FIG. 4. The increase in the source potential ΔV is subtracted from the gate to source voltage Vgs held in the storage capacitor Cs. Accordingly, this corresponds to the performance of a negative feedback. By negatively feeding back the output current Ids of the drive transistor Trd to the input voltage Vgs of the drive transistor Trd, the mobility μ can be corrected. It is to be noted that the negative feedback amount ΔV can be optimized by adjusting the time width t of the mobility correction period from the time T6 to the time T7.

At the time T7, the signal level of the control signal WS is changed to the low level, so that the sampling transistor Tr1 is turned off. As a result, the gate G of the drive transistor Trd is disconnected from the signal line SL. Since the application of the video signal Vsig to the drive transistor Trd is terminated, the gate potential (G) of the drive transistor Trd is allowed to increase. Subsequently, the gate potential (G) of the drive transistor Trd increases along with the increase in the source potential (S) of the drive transistor Trd. During this increase, the gate to source voltage Vgs held in the storage capacitor Cs is maintained at a level of (Vsig−ΔV+Vth). The increase in the source potential (S) of the drive transistor Trd releases the reverse biased state of the light-emitting element EL. Therefore, the output current Ids is allowed to flow to the light-emitting element EL, and the light-emitting element EL starts to emit light. The relationship at that time between the drain current Ids and the gate to source voltage Vgs is expressed by Equation 2 that is obtained by substituting (Vsig−ΔV+Vth) for Vgs in the above-described transistor characteristic equation 1.

$$Ids = k\mu(Vgs-Vth)^2 = k\mu(Vsig-\Delta V)^2 \quad \text{Equation 2}$$

where k corresponds to (½)(W/L)Cox (k=(½)(W/L)Cox). Equation 2 does not include the term of the threshold voltage Vth. That is, as is apparent from Equation 2, the output current Ids supplied to the light-emitting element EL has no dependence on the threshold voltage Vth of the drive transistor Trd. The drain current Ids is basically determined by the voltage of the video signal Vsig. That is, the light-emitting element EL emits light at a luminance level that is determined in accordance with the video signal Vsig. At that time, the voltage of the video signal Vsig is corrected by the feedback amount ΔV.

The correction amount ΔV is used to cancel the effect of the mobility μ included in the coefficient part in Equation 2. Accordingly, in reality, the drain current Ids depends only on the video signal Vsig.

Subsequently, at a time T8, the signal level of the control signal DS is changed to the high level, so that the transistor Tr4 is turned off. As a result, the light emission is terminated, and the field ends. Subsequently the next field starts, and the Vth correction, the mobility correction, and the light emission are then repeated again.

Figure 5:
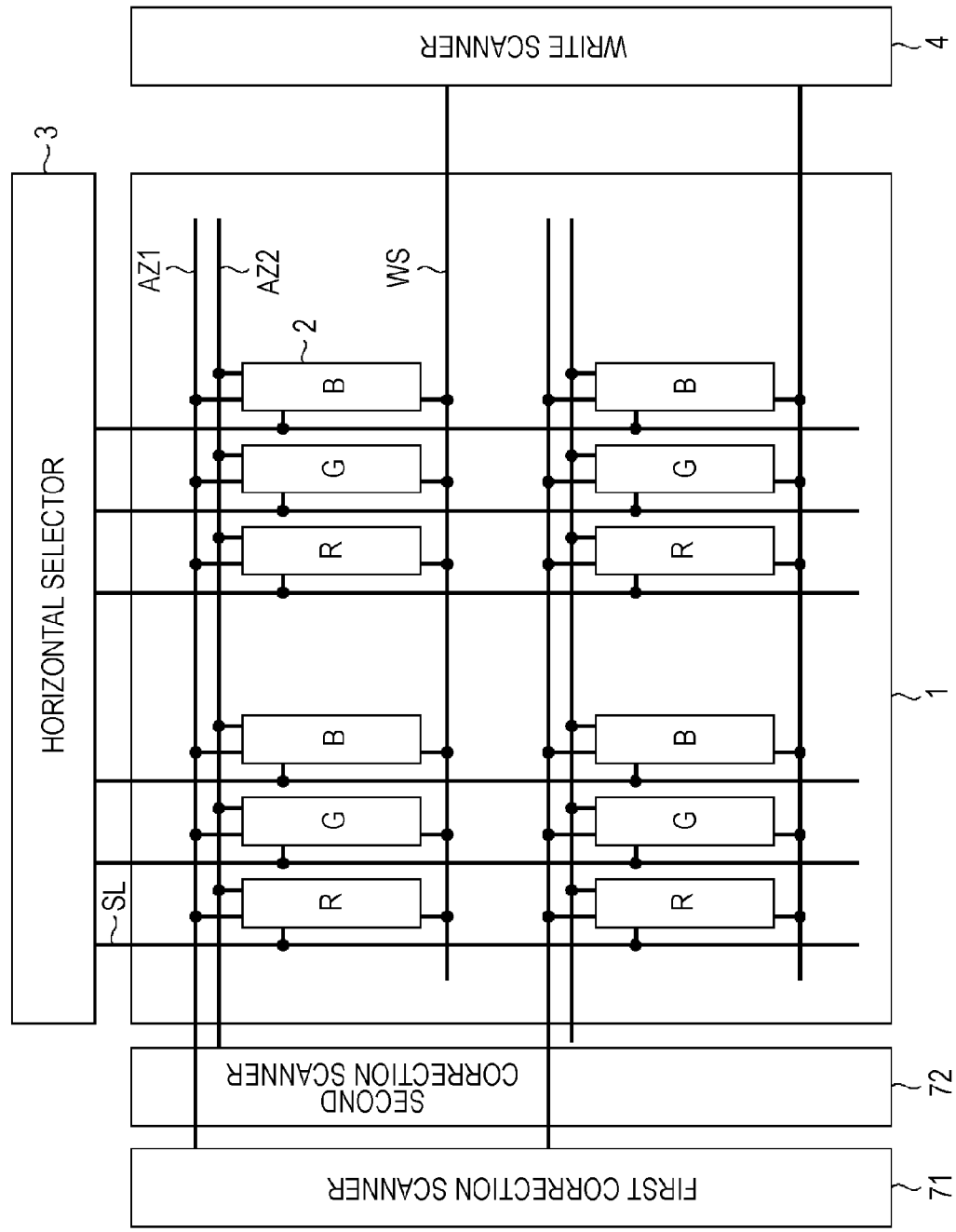
FIG. 5 is a block diagram illustrating an entire configuration of a display device according to a first embodiment of the present invention.

As described previously, the above-described exemplary display device requires four scanners to drive the pixel array. This hinders the miniaturization of a frame. FIG. 5 illustrates a display device according to a first embodiment of the present invention which can overcome the difficulty of the exemplary display device. As illustrated in FIG. 5, an active matrix display device according to the first embodiment includes the pixel array 1 serving as a main portion and a peripheral driving portion. The peripheral driving portion includes the horizontal selector 3, the write scanner 4, the first correction scanner 71, and the second correction scanner 72. The pixel array 1 has the pixel circuits 2 arranged at intersections of the row scanning lines WS and the column signal lines SL in a matrix form. The horizontal selector 3 drives the signal lines SL. The horizontal selector 3 is a signal portion for providing a signal potential and a predetermined potential, which serve as a video signal, to the signal lines SL in a time-division manner. The predetermined potential is used to cut off a drive transistor. The write scanner 4 scans the scanning lines WS. In addition to the scanning lines WS, the scanning lines AZ1 and AZ2 are provided. The first correction scanner 71 and the second correction scanner 72 scan the scanning lines AZ1 and the scanning lines AZ2, respectively. The write scanner 4, the first correction scanner 71, and the second correction scanner 72 form a scanner portion for sequentially scanning rows of pixels in every horizontal scanning period. As is apparent from the comparison between the exemplary display device illustrated in FIG. 1 and a display device according to the first embodiment illustrated in FIG. 5, the display device illustrated in FIG. 5 has a total of three scanners, one fewer than the number of scanners the exemplary display device has, and therefore can achieve the miniaturization of a frame.

When the pixel circuit 2 is selected by the scanning line WS, the pixel circuit 2 performs sampling of the signal potential of the video signal supplied from the signal line SL. When the pixel circuit 2 is selected by the scanning line WS at a certain time different from the above-described time, the pixel circuit 2 performs sampling of the predetermined potential supplied from the signal line SL and cuts off the drive transistor included therein so as to switch from the light-emission period to the non-light-emission period. Furthermore, when the pixel circuit 2 is scanned by the scanning lines AZ1 and AZ2, the pixel circuit 2 performs correction operations determined in advance in the non-light-emission period.

Figure 6:
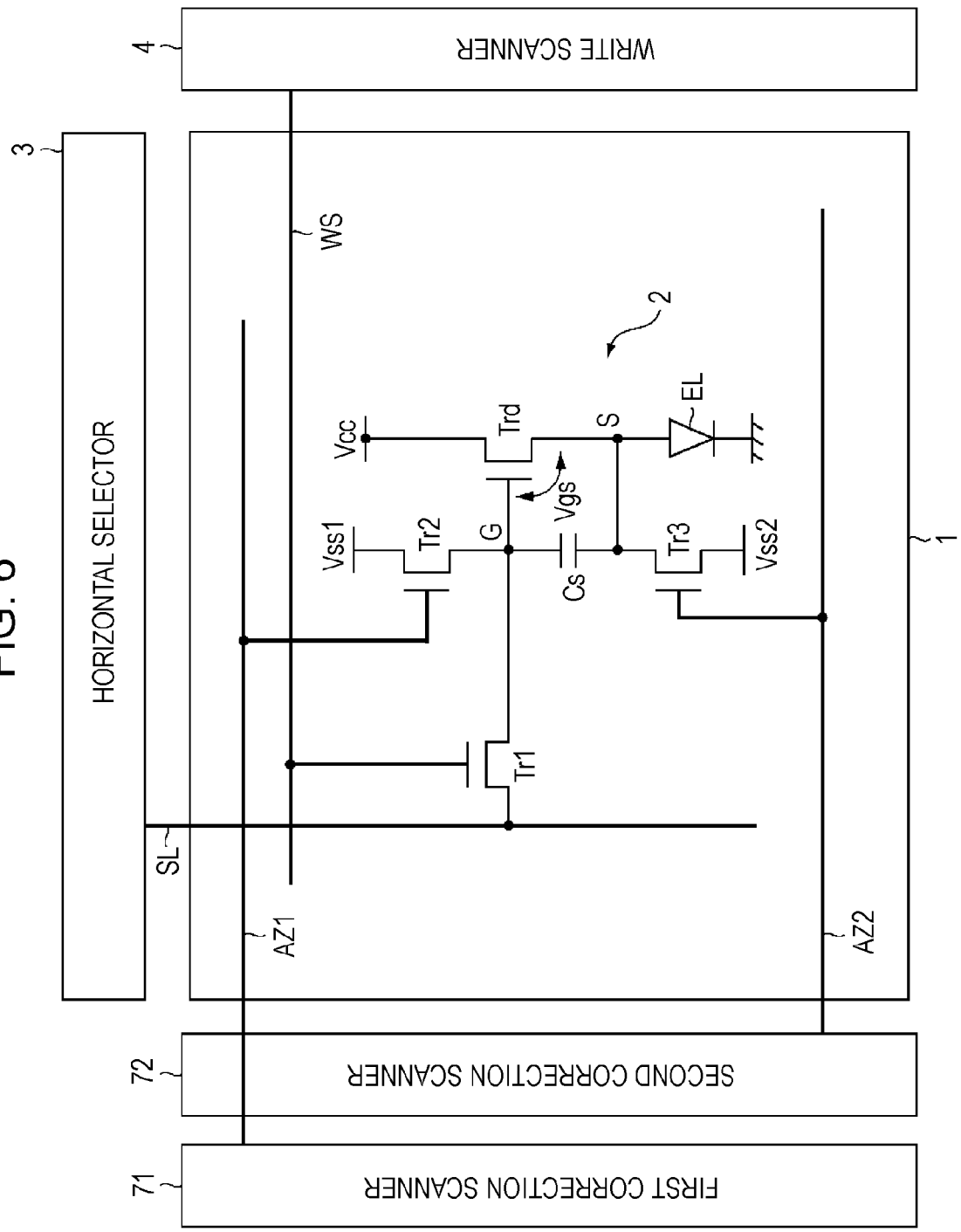
FIG. 6 is a circuit diagram illustrating a configuration of a pixel included in the display device according to the first embodiment illustrated in FIG. 5.

FIG. 6 is a circuit diagram illustrating a configuration of each of the pixel circuits 2 included in a display device according to the first embodiment illustrated in FIG. 5. As illustrated in FIG. 6, the drive transistor Trd, which is a central component of the pixel circuit 2, has a gate G connected to one end of the storage capacitor Cs and a source S connected to the other end of the storage capacitor Cs. The gate G of the drive transistor Trd is also connected to the reference potential Vss1 via the switching transistor Tr2. The gate of the switching transistor Tr2 is connected to the scanning line AZ1. The drain of the drive transistor Trd is connected to the power supply Vcc. The anode of the light-emitting element EL is connected to the source S of the drive transistor Trd, and the cathode of the light-emitting element EL is connected to the ground. The transistor Tr3 is connected between the source S of the drive transistor Trd and the predetermined reference potential Vss2. The gate of the switching transistor Tr3 is connected to the scanning line AZ2. The sampling transistor Tr1 is connected between the signal line SL and the gate G of the drive transistor Trd. The gate of the sampling transistor Tr1 is connected to the scanning line WS.

Figure 7:
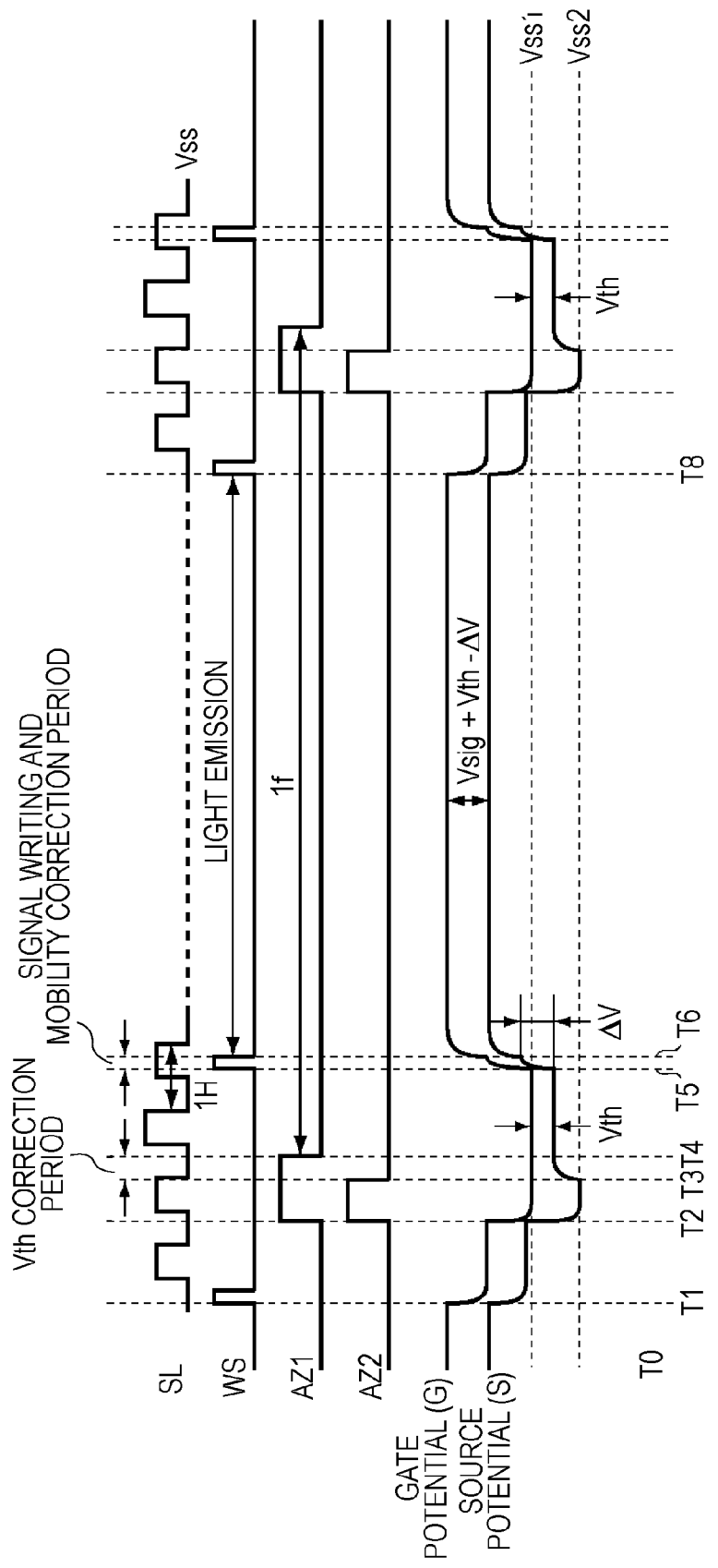
FIG. 7 is a timing chart used to describe an operation of a display device according to the first embodiment.

FIG. 7 is a timing chart used to describe the operation of a display device according to the first embodiment illustrated in FIGS. 5 and 6. In order to make this embodiment more easily understandable, this timing chart is generated in the same manner as used for the generation of the timing chart in FIG. 4 for the exemplary display device. As illustrated in FIG. 7, the signal line SL receives a video signal in which a signal potential Vsig and a predetermined reference potential Vss are switched in one horizontal scanning period (1H). The predetermined reference potential Vss is set in advance to a potential at which the drive transistor can be cut off. When the predetermined reference potential Vss is supplied to the signal line SL at the time T1, a control signal pulse is applied to the scanning line WS. As a result, the sampling transistor Tr1 is turned on, and the predetermined reference potential Vss flows to the pixel circuit 2 from the signal line SL, and is then applied to the gate G of the drive transistor Trd. Subsequently, the drive transistor Trd is cut off, and then the light-emission period is switched to the non-light-emission period in the pixel circuit 2.

That is, since no current is supplied to the light-emitting element EL when the drive transistor Trd is cut off, the light-emitting element EL stops emitting light. Thus, unlike the exemplary display device in which the switching between the light-emission period and the non-light-emission period is performed by turning on and off the switching transistor, in this embodiment, the switching between the light-emission period and the non-light-emission period is performed by controlling the sampling transistor and cutting off the drive transistor. This method can reduce the numbers of switching transistors and scanners.

At the time T2, the signal levels of the control signals AZ1 and AZ2 are changed to the high level, so that both of the switching transistors Tr2 and Tr3 are turned on. Since the switching transistor Tr2 is turned on, the reference potential Vss1 is applied to the gate G of the drive transistor Trd. Since the switching transistor Tr3 is turned on, the reference potential Vss2 is applied to the source S of the drive transistor Trd. Consequently, the potentials of the gate G and the source S of the drive transistor Trd are each reset to a predetermined condition, the preparation for the threshold voltage correction is made, and the drive transistor Trd is turned on.

At the time T3, the signal level of the control signal AZ2 is changed back to the low level, so that the switching transistor Tr3 is turned off and the source S of the drive transistor Trd is disconnected from the reference potential Vss2. Subsequently, the threshold voltage correction is performed. During the threshold voltage correction, the potential of the source S of the drive transistor Trd increases with the potential of the gate G of the drive transistor Trd fixed to the predetermined reference potential Vss1. When the difference between the potential of the gate G and the potential of the source S becomes equal to the threshold voltage Vth, the drive transistor Trd is cut off and the threshold voltage correction is completed. Subsequently, at the time T4, the signal level of the control signal AZ1 is changed back to the low level, so that the switching transistor Tr2 is turned off.

At the time T5 after the predetermined reference potential Vss has been changed to the signal potential Vsig in the signal line SL, the control signal pulse is applied to the scanning line WS again, so that the sampling transistor Tr1 is turned on. As a result, the signal potential Vsig supplied from the signal line SL is sampled and is then stored in the storage capacitor Cs. At the same time, the mobility correction is performed, and then the amount of the mobility correction ΔV is stored in the storage capacitor Cs. The period from the time T5 at which the signal level of the control signal WS is changed to the high level to the time T6 at which the signal level of the control signal WS is changed back to the low level is a signal writing period and a mobility correction period.

When the signal level of the control signal WS is changed back to the low level at the time T6, the sampling transistor Tr1 is turned off, so that the gate G of the drive transistor Trd is disconnected from the signal line SL. As a result, a bootstrap operation can be performed. By performing the bootstrap operation, the potential of the source S of the drive transistor Trd increases, a driving current passes through the light-emitting element EL, and then the non-light-emission period is switched to the light-emission period.

Figure 8:
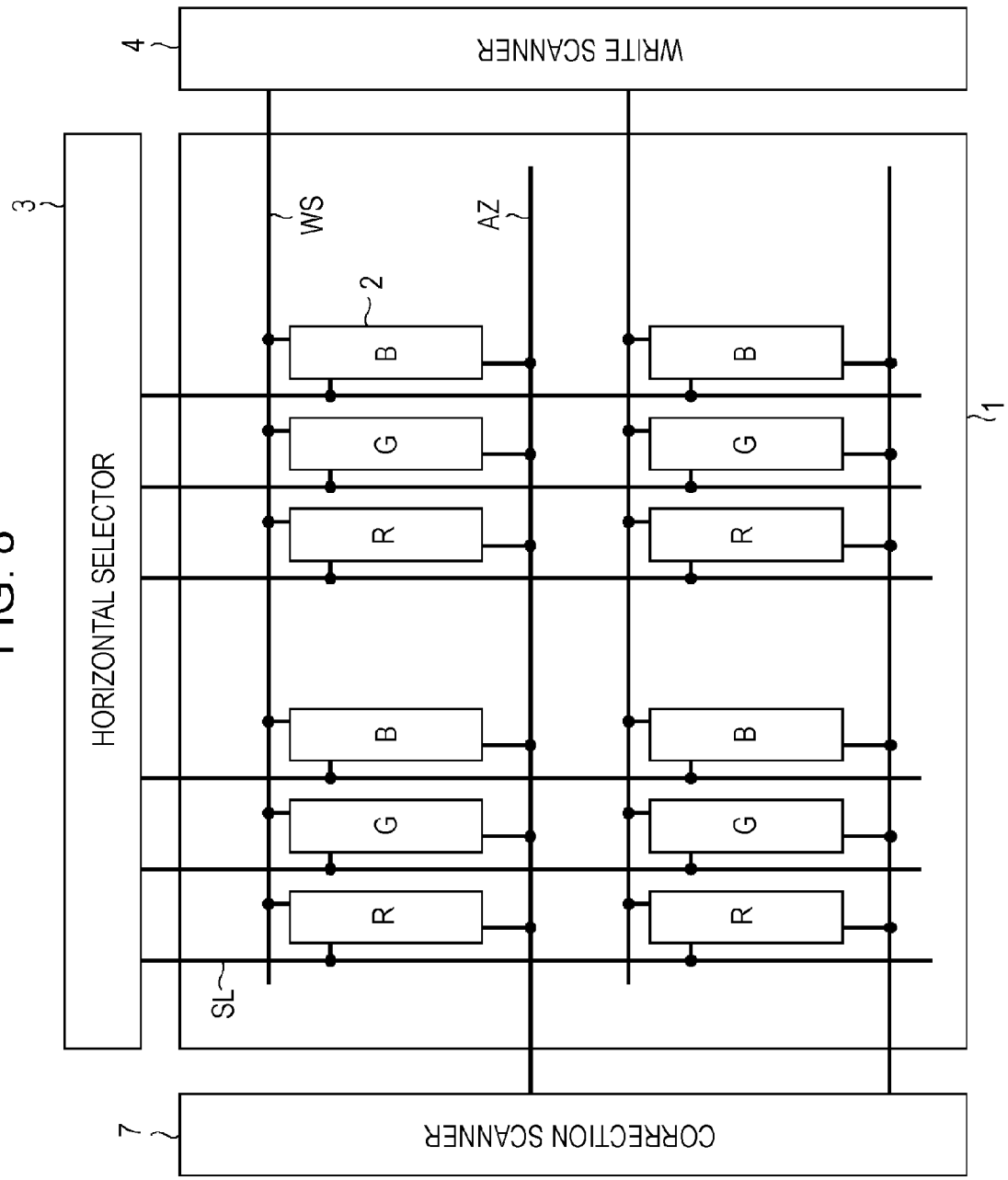
FIG. 8 is a diagram illustrating an entire configuration of a display device according to a second embodiment of the present invention.

FIG. 8 is a block diagram illustrating the entire configuration of a display device according to a second embodiment of the present invention. A display device according to the second embodiment includes the pixel array 1 and a driving portion for driving the pixel array 1. The pixel array 1 includes the first row scanning lines WS, the second row scanning lines AZ, the column signal lines SL, and the pixel circuits 2 that are arranged in a matrix form at intersections of the first row scanning lines WS and the column signal lines SL. The driving portion includes the write scanner 4, a correction scanner 7, and the horizontal selector 3. The write scanner 4 outputs a control signal to each of the first row scanning lines WS, thereby sequentially scanning the pixel circuits 2 on the first row scanning line WS. The correction scanner 7 outputs a control signal to each of the second row scanning lines AZ, thereby sequentially scanning the pixel circuits 2 on the second row scanning line AZ. The time at which the write scanner 4 outputs the control signal and the time at which the correction scanner 7 outputs the control signal are different from each other. The horizontal selector 3 supplies the signal potential and the reference potential, which serve as a video signal, to each of the column signal lines SL in synchronization with the sequential row scanning performed by each of the write scanner 4 and the correction scanner 7.

Figure 9:
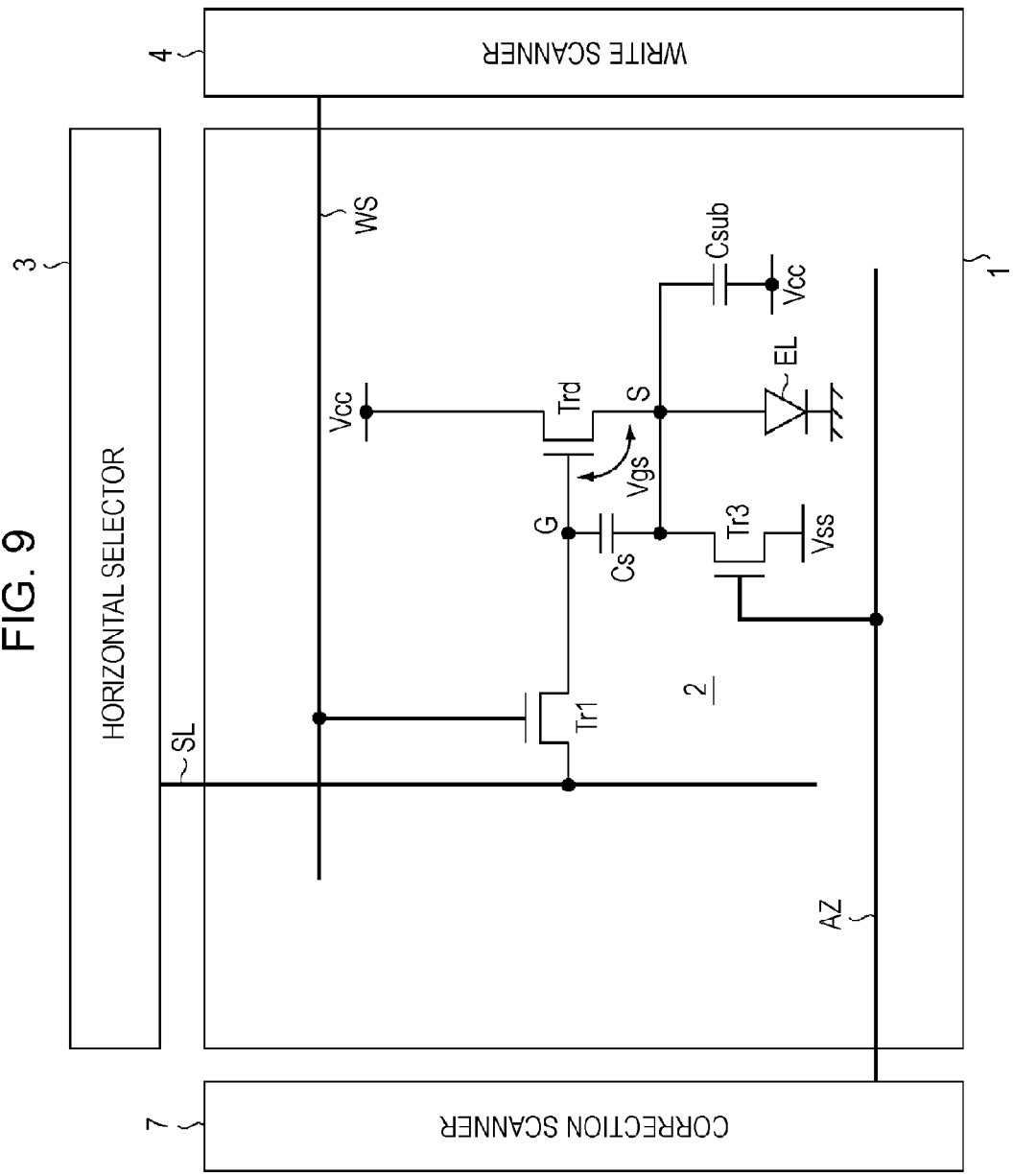
FIG. 9 is a circuit diagram illustrating a configuration of a pixel included in a display device according to the second embodiment.

FIG. 9 is a circuit diagram illustrating a configuration of each of pixels included in the display device illustrated in FIG. 8. As illustrated in FIG. 9, the pixel circuit 2 includes the light-emitting element EL, the sampling transistor Tr1, the drive transistor Trd, the switching transistor Tr3, and the storage capacitor Cs. The sampling transistor Tr1 has a control terminal (gate) connected to the scanning line WS and a pair of current terminals (source and drain), one of which is connected to the signal line SL and the other one of which is connected to a control terminal (gate G) of the drive transistor Trd. The drive transistor Trd has a pair of current terminals (source and drain), one of which (drain) is connected to the power supply Vcc and the other one of which (source S) is connected to the anode of the light-emitting element EL. The cathode of the light-emitting element EL is connected to the predetermined cathode potential Vcath. The switching transistor Tr3 has a control terminal (gate) connected to the scanning line AZ and a pair of current terminals (source and drain), one of which is connected to the fixed potential Vss and the other one of which is connected to the source S of the drive transistor Trd. The storage capacitor Cs has ends one of which is connected to the control terminal (gate G) of the drive transistor Trd and the other one of which is connected to the other one (source S) of the current terminals of the drive transistor Trd. The other one of the current terminals of the drive transistor Trd is used to output a current to the light-emitting element EL and the storage capacitor Cs. In the pixel circuit 2, an auxiliary capacitor Csub for the storage capacitor Cs is connected between the source S of the drive transistor Trd and the power supply Vcc.

In the above-described configuration, the write scanner 4, which is included in the driving portion, supplies to the first scanning line WS a control signal used for control of the opening and closing of the sampling transistor Tr1. The correction scanner 7 supplies to the second scanning line AZ a control signal used for control of the opening and closing of the switching transistor Tr3. The horizontal selector 3 supplies to the signal line SL a video signal (input signal) in which the switching between the signal potential Vsig and the reference potential Vref is performed. Thus, the potentials of the scanning lines WS and AZ and the signal line SL change in synchronization with the sequential row scanning. The potential of a power supply line is fixed to the power supply Vcc. The cathode potential Vcath and the fixed potential Vss are held constant.

Figure 10:
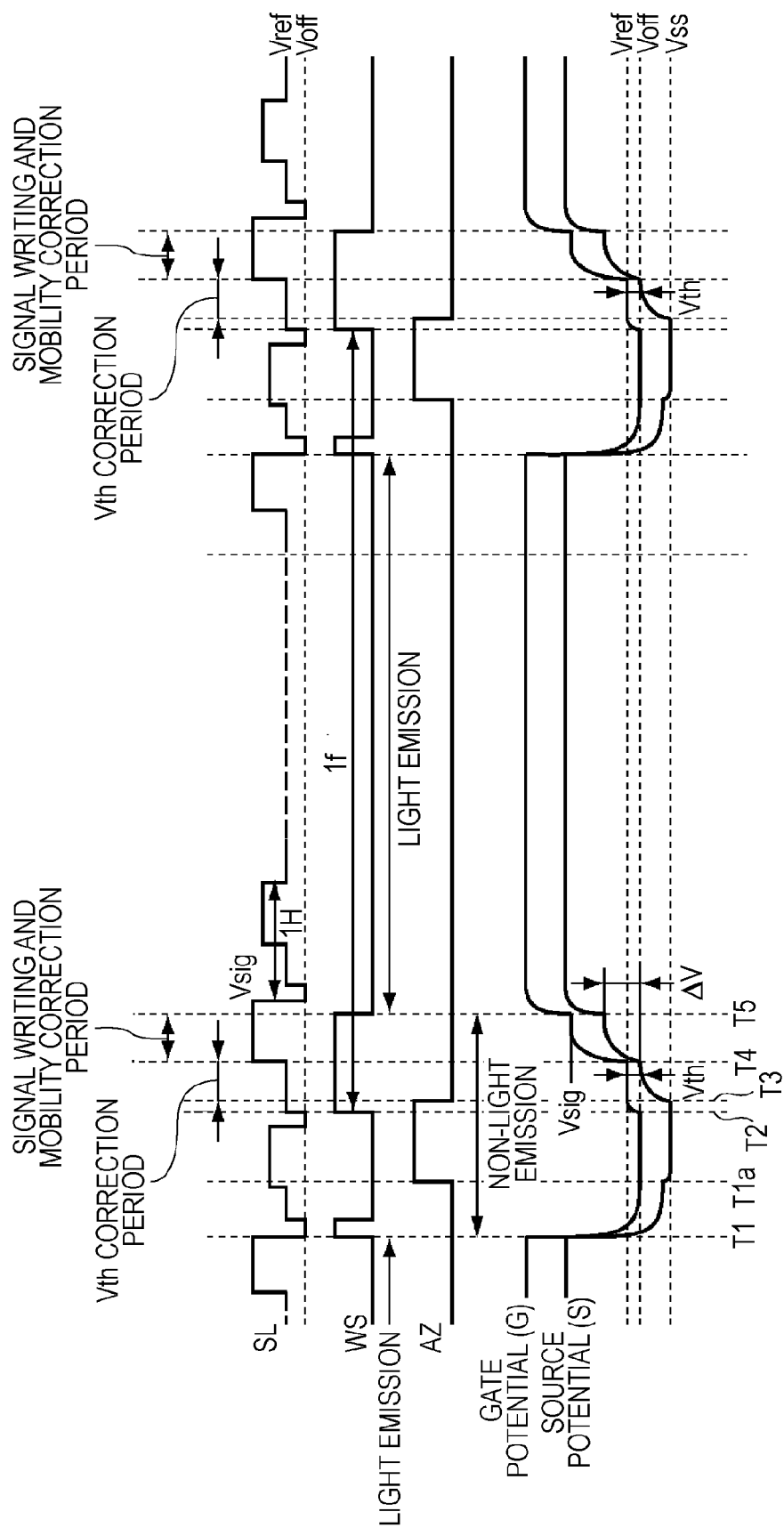
FIG. 10 is a timing chart used to describe an operation of a display device according to the second embodiment.

FIG. 10 is a timing chart used to describe the operation of a display device according to the second embodiment illustrated in FIGS. 8 and 9. In this embodiment, in the signal line SL, the switching among three potentials, the signal potential Vsig, the reference potential Vref, and an off potential Voff, is performed in one horizontal scanning period (1H). The signal potential Vsig is higher than the reference potential Vref. The off potential Voff is lower than the reference potential Vref. The off potential Voff is a predetermined potential used to cut off the drive transistor Trd. Two control signal pulses are supplied to the scanning line WS in one field (1f). A first control signal pulse is output so as to switch from the light-emission period in the preceding field to the non-light-emission period in the target field. A second control signal pulse is supplied when the threshold voltage correction, the signal writing, and the mobility correction are performed in the non-light-emission period in the target field.

At the time T1, the first control signal pulse is applied to the scanning line WS. At that time, the potential of the signal line SL is the predetermined off potential Voff. Subsequently, the sampling transistor Tr1 is turned on, so that the off potential Voff is sampled and is then applied to the gate G of the drive transistor Trd. As a result, the potential of the gate G of the drive transistor Trd is decreased and is then cut off. Therefore, the light-emission period is switched to the non-light-emission period in the pixel circuit.

At a time T1a, the signal level of the control signal AZ is changed from the low level to the high level, so that the switching transistor Tr3 is turned on. As a result, the reference potential Vss is applied to the source S of the drive transistor Trd.

At the time T2, the control signal pulse is applied to the scanning line WS again, so that the sampling transistor Tr1 is turned on. At that time, the potential of the signal line SL is the reference potential Vref. The reference potential Vref is applied to the gate G of the drive transistor Trd. Accordingly, the gate (G)-to-source (S) voltage Vgs of the drive transistor Trd is equal to a value represented by Vref−Vss. Here, the inequality Vgs=Vref−Vss>Vth is set. If the value of Vref−Vss is not larger than the threshold voltage Vth of the drive transistor Trd, the subsequent threshold voltage correction cannot be appropriately performed. It is to be noted that the drive transistor Trd is turned on at that time since the inequality of Vgs=Vref−Vss>Vth is satisfied, and a flow-through current flows from the power supply line Vcc to the fixed potential Vss. However, since the switching transistor Tr3 is turned off at the time T3 immediately after the time T2, the flow-through current becomes almost negligible.

At the time T3 at with the threshold voltage correction period starts, the switching transistor Tr3 is turned off, so that the source S of the drive transistor Trd is disconnected from the fixed potential Vss. As long as the potential of the source S of the drive transistor Trd (that is, the potential of the anode of the light-emitting element) is lower than the sum of the cathode potential Vcath and the threshold voltage VthEL of the light-emitting element EL, the light-emitting element EL is still in the reverse biased state and only a small amount of leakage current flows. Accordingly, the current supplied from the power supply line Vcc via the drive transistor Trd is used to charge the storage capacitor Cs and the auxiliary capacitor Csub. Thus, the storage capacitor Cs is charged, and the source potential of the drive transistor Trd therefore increases from the fixed potential Vss with the passage of time. After a predetermined time has elapsed, the source potential of the drive transistor Trd reaches the level of Vref−Vth, and Vgs becomes equal to Vth. At that time, the drive transistor Trd is cut off, so that a voltage corresponding to the threshold voltage Vth is stored in the storage capacitor Cs connected between the source S of the drive transistor Trd and the gate G of the drive transistor Trd. Even at the time at which the threshold voltage correction has been completed, the source voltage of Vref−Vth of the drive transistor Trd is lower than the sum of the cathode potential Vcath and the threshold voltage VthEL of the light-emitting element EL.

At the time T4 at which the signal writing period and the mobility correction period start, in the signal line SL, the reference potential Vref is changed to the signal potential Vsig. The signal potential Vsig is a voltage corresponding to gradation. At that time, since the sampling transistor Tr1 is in the on state, the potential of the gate G of the drive transistor Trd becomes the signal potential Vsig. As a result, the drive transistor Trd is turned on, so that a current flows from the power supply line Vcc. Therefore, the potential of the source S of the drive transistor Trd increases with the passage of time. At that time, since the potential of the source S of the drive transistor Trd do not exceed the sum of the threshold voltage VthEL of the light-emitting element EL and the cathode potential Vcath, only a small amount of leakage current flows through the light-emitting element EL. Almost all of the current supplied from the drive transistor Trd is used to charge the storage capacitor Cs and the auxiliary capacitor Csub. During the charging of the storage capacitor Cs and the auxiliary capacitor Csub, as described preciously, the potential of the source S of the drive transistor Trd increases.

In this signal writing period, the threshold voltage correction for the drive transistor Trd has already been completed. Accordingly, the drive transistor Trd supplies a current that reflects the mobility μ. More specifically, if the mobility μ of the drive transistor Trd is large, the amount of current supplied by the drive transistor Trd becomes large and the potential of the source S of the drive transistor Trd also rapidly increases. Conversely, if the mobility μ of the drive transistor Trd is small, the amount of current supplied by the drive transistor Trd becomes small and the potential of the source S of the drive transistor Trd increases slowly. Thus, by negatively feeding back the output current of the drive transistor Trd to the storage capacitor Cs, the gate (G)-to-source (S) voltage Vgs of the drive transistor Trd becomes a value reflecting the mobility μ. After a certain period of time has elapsed, the gate (G)-to-source (S) voltage Vgs in which the mobility μ is perfectly corrected can be obtained. That is, in this signal writing period, by negatively feeding back the current output from the drive transistor Trd to the storage capacitor Cs, the correction of the mobility μ of the drive transistor Trd is simultaneously performed.

At the time T5 at which the light-emission period starts in the target field, the sampling transistor Tr1 is turned off, so that the gate G of the drive transistor Trd is disconnected from the signal line SL. This allows the potential of the gate G of the drive transistor Trd to increase. The potential of the source S of the drive transistor Trd increases in synchronization with the increase in the potential of the gate G of the drive transistor Trd while the gate to source voltage Vgs stored in the storage capacitor Cs is held constant. As a result, the reverse biased state of the light-emitting element EL is released, so that the drive transistor Trd supplies the drain current Ids to the light-emitting element EL in accordance with the gate to source voltage Vgs. The potential of the source S of the drive transistor Trd increases until the current flows through the light-emitting element EL, and then the light-emitting element EL emits light. If the light-emission period of the light-emitting element EL becomes longer, the current-voltage characteristic of the light-emitting element EL is changed. Therefore, the potential of the source S of the drive transistor Trd is also changed. However, since the gate to source voltage Vgs of the drive transistor Trd is held constant by performing the bootstrap operation, the current flowing through the light-emitting element EL is not changed. Accordingly, even if the current-voltage characteristic of the light-emitting element EL deteriorates, the constant drain current Ids continuously flows through the light-emitting element EL. The luminance level of the light-emitting element EL is not changed.

Figure 11:
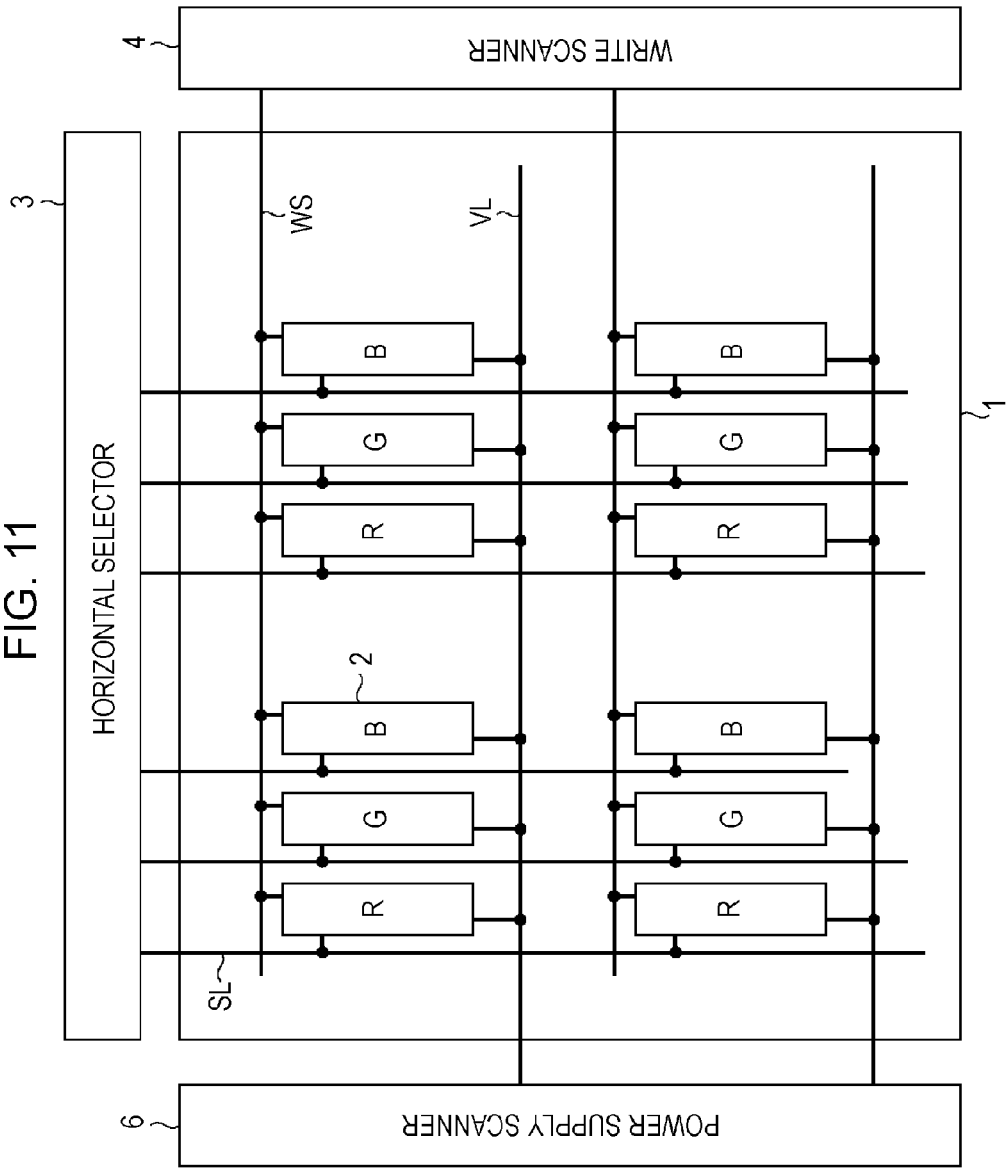
FIG. 11 is a diagram illustrating an entire configuration of a display device according to a third embodiment of the present invention.

FIG. 11 is a diagram illustrating the entire configuration of a display device according to a third embodiment of the present invention. Like a display device according to the second embodiment, a display device according to the third embodiment has a peripheral driving portion including two scanners. As compared with a display device according to the first embodiment, the miniaturization of a frame is further achieved. As illustrated in FIG. 11, this display device includes the pixel array 1 and a driving portion for driving the pixel array 1. The pixel array 1 includes the row scanning lines WS, the column signal lines SL, the pixel circuits 2 that are individually disposed at intersections of the scanning lines WS and the signal lines SL, and electric supply lines (power lines) VL disposed along the individual rows of the pixel circuits 2. The display device according to this embodiment can perform color display using the pixel circuits 2 each of which is an R, G, or B pixel. However, the display device capable of performing color display may not necessarily be used, and a monochrome display device may be used. The driving portion includes the write scanner 4 for sequentially supplying control signals to the scanning lines WS to sequentially scan the rows of the pixel circuits 2, the power supply scanner 6 for supplying to each of the electric supply lines VL in synchronization with the sequential row scanning a power supply voltage used to switch between a first potential and a second potential, and the signal selector (horizontal selector) 3 for supplying a signal potential and a reference potential, which function as a driving signal, to the column signal lines SL in synchronization with the sequential row scanning.

Figure 12:
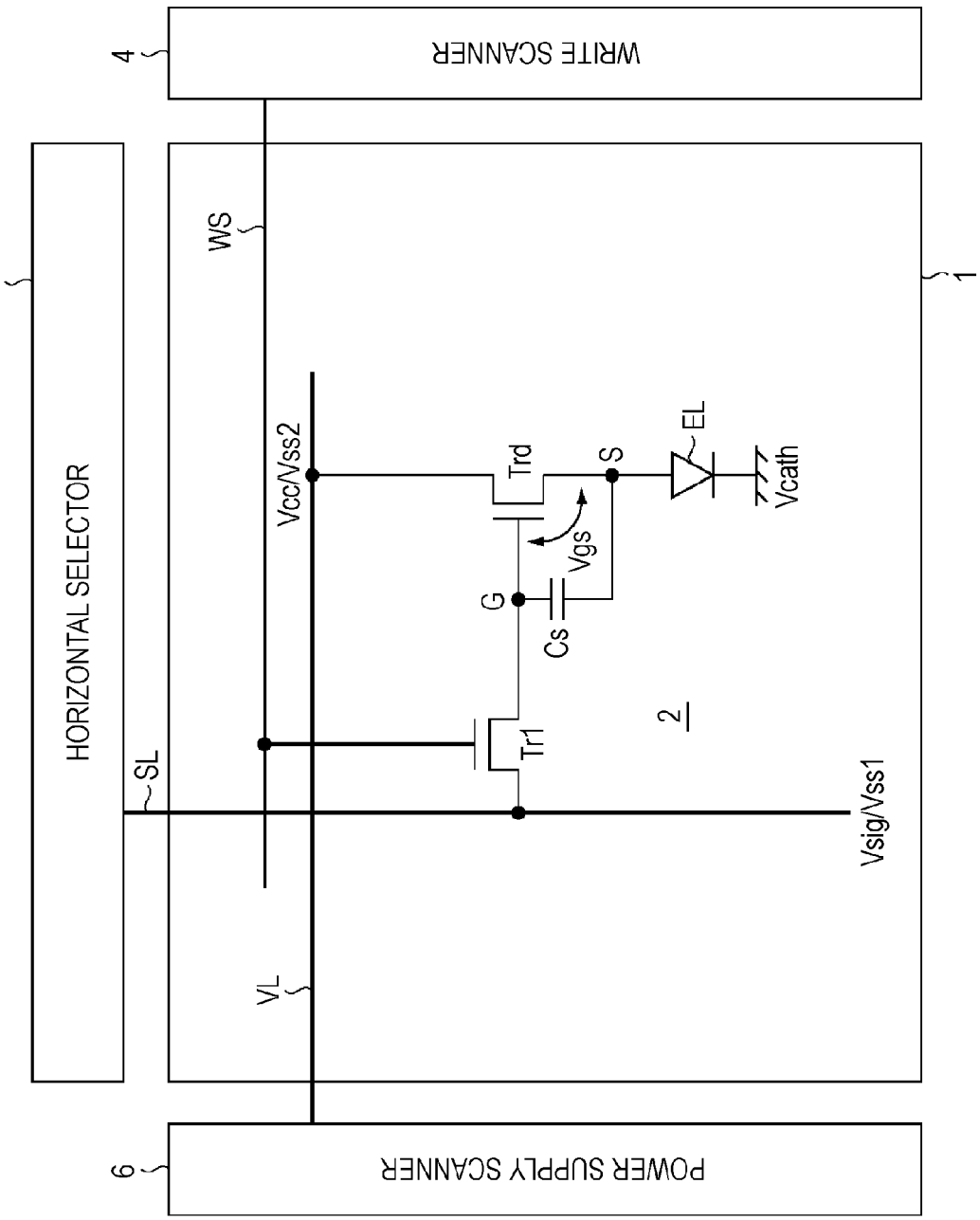
FIG. 12 is a circuit diagram illustrating a configuration of a pixel included in the display device according to the third embodiment illustrated in FIG. 11.

FIG. 12 is a circuit diagram illustrating a detailed configuration of the pixel circuit 2 included in the display device illustrated in FIG. 11 and a connection relationship. As compared with the pixel circuit according to the second embodiment illustrated in FIG. 9, the number of transistors is reduced to two from three in a pixel circuit illustrated in FIG. 9, whereby high-definition pixels can be obtained. As illustrated in FIG. 12, the pixel circuit 2 includes the light-emitting element EL such as an organic EL element, the sampling transistor Tr1, the drive transistor Trd, and the storage capacitor Cs. The sampling transistor Tr1 has a control terminal (gate) connected to the corresponding scanning line WS and a pair of current terminals (source and drain) one of which is connected to the corresponding signal line SL and the other one of which is connected to the control terminal (gate G) of the drive transistor Trd. The drive transistor Trd has a pair of current terminals (source S and drain) one of which is connected to the light-emitting element EL and the other one of which is connected to the corresponding electric supply line VL. In this embodiment, the drive transistor Trd is an N-channel transistor, and has the drain connected to the electric supply line VL and the source S connected to the anode of the light-emitting element EL as an output node. The cathode of the light-emitting element EL is connected to the predetermined cathode potential Vcath. The storage capacitor Cs is connected between the source S of the drive transistor Trd, which is one of the current terminals, and the gate G of the drive transistor Trd, which is the control terminal.

In the above-described configuration, the sampling transistor Tr1 is brought into conduction in response to a control signal supplied from the scanning line WS, samples the signal potential supplied from the signal line SL, and holds the sampled signal potential in the storage capacitor Cs. In response to a current supplied from the electric supply line VL that is in a first potential (high potential Vcc), the drive transistor Trd passes a driving current to the light-emitting element EL in accordance with the signal potential held in the storage capacitor Cs. The write scanner 4 outputs a control signal of a predetermined pulse width to the scanning line WS so as to bring the sampling transistor Tr1 into conduction in a period in which the potential of the signal line SL is the signal potential, thereby holding the signal potential in the storage capacitor Cs as well as performing the correction of the mobility μ of the drive transistor Trd upon the signal potential. Subsequently, the drive transistor Trd supplies a driving current to the light-emitting element EL in accordance with the signal potential Vsig held in the storage capacitor Cs so as to cause the light-emitting element EL to emit light.

The pixel circuit 2 has the threshold voltage correction function in addition to the above-described mobility correction function. That is, before the sampling transistor Tr1 samples the signal potential Vsig, the power supply scanner 6 switches from the first potential (high potential Vcc) to a second potential (low potential Vss2) for the electric supply line VL at a first time. Furthermore, before the sampling transistor Tr1 samples the signal potential Vsig, the write scanner 4 brings the sampling transistor Tr1 into conduction at a second time so as to apply the reference potential Vss1 supplied from the signal line SL to the gate G of the drive transistor Trd as well as setting the potential of the source S of the drive transistor Trd to the second potential (Vss2). At a third time after the second time, the power supply scanner 6 switches from the second potential Vss2 to the first potential Vcc for the electric supply line VL so as to hold a voltage corresponding to the threshold voltage Vth of the drive transistor Trd in the storage capacitor Cs. By performing the above-described threshold voltage correction function, it is possible to cancel variations among pixels in terms of the threshold voltage Vth of the drive transistor Trd.

The pixel circuit 2 also has a bootstrap function. That is, the write scanner 4 terminates the application of the control signal to the scanning line WS when the signal potential Vsig is held in the storage capacitor Cs so as to bring the sampling transistor Tr1 out of conduction and electrically disconnect the gate G of the drive transistor Trd from the signal line SL. As a result, the potential of the gate G is changed in synchronization with the change in the potential of the source S of the drive transistor Trd. Consequently, the voltage Vgs between the gate G and the source S can be maintained constant.

Figure 13:
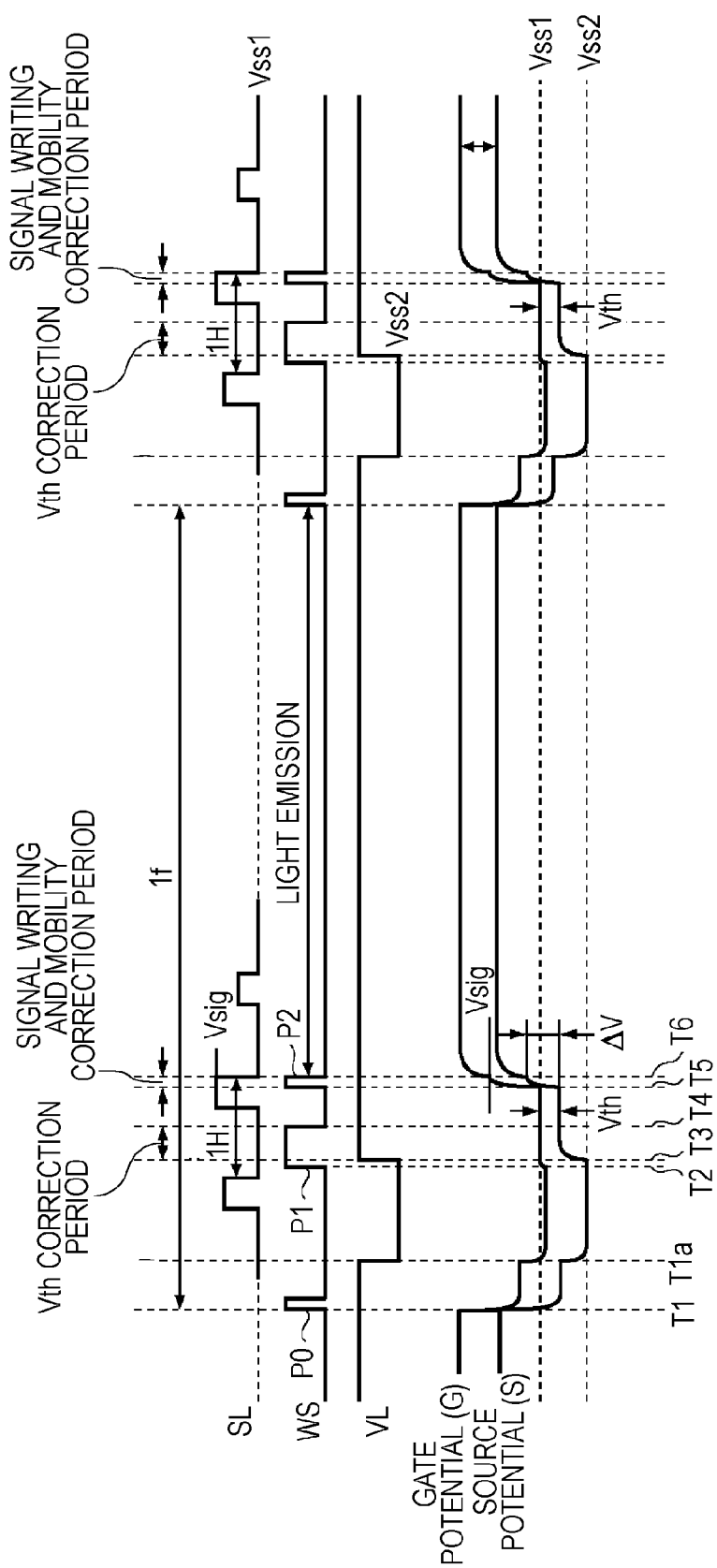
FIG. 13 is a timing chart used to describe an operation of a display device according to the third embodiment.

FIG. 13 is a timing chart used to describe the operation of the pixel circuit 2 illustrated in FIG. 12. Referring to FIG. 13, the changes in the potentials of the scanning line WS, the electric supply line VL, and the signal line SL are illustrated along a time axis. In addition to these potential changes, the potential changes of the gate G and the source S of the drive transistor are illustrated.

The feature of this embodiment is that a control signal pulse is applied to the scanning line WS so as to turn on the sampling transistor Tr1. Three control signal pulses are applied to the scanning line WS in one field period (1f) in synchronization with the sequential row scanning of the pixel array portion. Among the three control signal pulses, a first pulse, a second pulse, and a third pulse are defined as a pulse P0, a pulse P1, and a pulse P2, respectively. The potential of the electric supply line VL is switched between the high potential Vcc and the low potential Vss2 in one field period (1f). A driving signal in which the switching between the signal potential Vsig and the predetermined reference potential Vss1 is performed in one horizontal scanning period (1H) is supplied to the signal line SL.

As illustrated in the timing chart in FIG. 13, in a pixel, if the light-emission period ends in a field preceding a target field, then the non-light-emission period starts in the target field. If the non-light-emission period ends in the target field, then the light-emission period starts in the target field. In the non-light-emission period, the preparatory operation, the threshold voltage correction, the signal writing, and the mobility correction are performed.

In the light-emission period in the preceding field, the potential of the electric supply line VL is the high potential Vcc, and the drive transistor Trd supplies the driving current Ids to the light-emitting element EL. The driving current Ids flows from the electric supply line VL of the high potential Vcc to a cathode line via the drive transistor Trd and the light-emitting element EL.

Subsequently, when the non-light-emission period starts in the target field, at the time T1, the first control signal pulse P0 is applied to the scanning line WS. At that time, the potential of the signal line SL is the predetermined reference potential Vss1. In response to the first control signal pulse P0, the sampling transistor Tr1 is turned on, so that the predetermined reference potential Vss1 is applied from the signal line SL to the gate of the drive transistor Trd. As a result, the potential of the gate G of the drive transistor Trd rapidly decreases, thereby being cut off. Consequently, the light-emission period is switched to the non-light-emission period in the pixel.

Subsequently, at the time T1a, the potential of the electric supply line VL is changed from the high potential Vcc to the low potential Vss2. As a result, the electric supply line VL is discharged to the reference potential Vss2, and the potential of the source S of the drive transistor Trd also decreases to the reference potential Vss2.

Subsequently, at the time T2, the potential of the scanning line WS is changed from the low level to the high level, so that the sampling transistor Tr1 is brought into conduction. At that time, the potential of the signal line SL is the reference potential Vss1. Accordingly, the reference potential Vss1 is applied from the signal line SL to the gate G of the drive transistor Trd via the sampling transistor Tr1 that has been brought into conduction. At that time, the potential of the source S of the drive transistor Trd is the reference potential Vss2 much lower than the reference potential Vss1. Thus, the voltage Vgs between the gate G and the source S of the drive transistor Trd is initialized such that the voltage Vgs becomes larger than the threshold voltage Vth of the drive transistor Trd. The period from the time T1 to the time T3 is a preparation period in which the voltage Vgs between the gate G and the source S of the drive transistor Trd is set to a voltage larger than the threshold voltage Vth of the drive transistor Trd.

At the time T3, the potential of the electric supply line VL is changed from the low potential Vss2 to the high potential Vcc, and the potential of the source S of the drive transistor Trd starts to increase. When the voltage Vgs between the gate G and the source S of the drive transistor Trd becomes equal to the threshold voltage Vth, a current is cut off. Thus, a voltage corresponding to the threshold voltage Vth of the drive transistor Trd is stored in the storage capacitor Cs. This process is the threshold voltage correction. At that time, in order to pass a current to the storage capacitor Cs and prevent the current from flowing through the light-emitting element EL, the cathode potential Vcath is set to a potential at which the light-emitting element EL can be cut off.

At the time T4, the potential of the scanning line WS is changed from the high level to the low level. That is, the application of the pulse P1 to the scanning line WS is terminated, and then the sampling transistor Tr1 is turned off. Thus, the pulse P1 is applied to the gate of the sampling transistor Tr1 for the threshold voltage correction.

Subsequently, the potential of the signal line SL is changed from the reference potential Vss1 to the signal potential Vsig. At the time T5, the potential of the scanning line WS is changed from the low level to the high level. That is, the pulse P2 is applied to the gate of the sampling transistor Tr1. As a result, the sampling transistor Tr1 is turned on again, and then performs sampling of the signal potential Vsig supplied from the signal line SL. Accordingly, the potential of the gate G of the drive transistor Trd becomes the signal potential Vsig. At that time, since the light-emitting element EL is in the cut-off state (high-impedance state), the drain-to-source current of the drive transistor Trd flows to the storage capacitor Cs and the equivalent capacitor of the light-emitting element EL, thereby starting to charge them. Until the time T6 at which the sampling transistor Tr1 is turned off, the potential of the source S of the drive transistor Trd increases by the voltage $\Delta V$. Thus, the signal potential Vsig is added to the threshold voltage Vth and is then stored in the storage capacitor Cs, and the voltage $\Delta V$ used for the mobility correction is subtracted from the voltage held in the storage capacitor Cs. Accordingly, a period from the time T5 to the time T6 is the signal writing period and the mobility correction period. That is, if the pulse P2 is applied to the scanning line WS, the signal writing and the mobility correction are performed. The period from the time T5 to the time T6, which is the signal writing period and the mobility correction period, is equal to the pulse width of the pulse P2. That is, the mobility correction period is determined in accordance with the pulse width of the pulse P2.

Thus, in the period from the time T5 to the time T6 that is the signal writing period, the storage of the signal potential Vsig and the adjustment of the amount of correction $\Delta V$ are simultaneously performed. The higher the signal potential Vsig, the larger the amount of the current Ids supplied by the drive transistor Trd and the absolute value of the amount of correction $\Delta V$. Accordingly, the mobility correction is performed in accordance with a light emission luminance level.

It is assumed that the signal potential Vsig is constant. In this case, the larger the mobility $\mu$, the larger the absolute value of the amount of correction $\Delta V$. That is, the larger the mobility $\mu$, the larger the amount of negative feedback $\Delta V$ to the storage capacitor Cs. Accordingly, the variations among pixels in terms of the mobility $\mu$ can be canceled.

At the time T6, as described previously, the potential of the scanning line WS is changed to the low level, so that the sampling transistor Tr1 is turned off. As a result, the gate G of the drive transistor Trd is disconnected from the signal line SL. At the same time, the drain current Ids starts to flow through the light-emitting element EL. As a result, the anode potential of the light-emitting element EL increases in accordance with the driving current Ids. That is, the increase in the anode potential of the light-emitting element EL is the increase in the potential of the source S of the drive transistor Trd. When the potential of the source S of the drive transistor Trd increases, the bootstrap operation is performed by the hold capacitor Cs and the potential of the gate G of the drive transistor Trd also increases. The amount of increase in the gate potential is equal to the amount of increase in the source potential. Accordingly, during the light-emission period, the voltage Vgs between the gate G and the source S of the drive transistor Trd is maintained constant. At that time, the value of the voltage Vgs is a value obtained by performing the correction of the threshold voltage Vth and the correction of the mobility $\mu$ upon the signal potential Vsig. The drive transistor Trd operates in a saturated region. That is, the drive transistor Trd supplies the driving current Ids in accordance with the gate (G)-to-source (S) voltage Vgs. At that time, the value of the voltage Vgs is a value obtained by performing the correction of the threshold voltage Vth and the correction of the mobility $\mu$ upon the signal potential Vsig.

Figure 14:
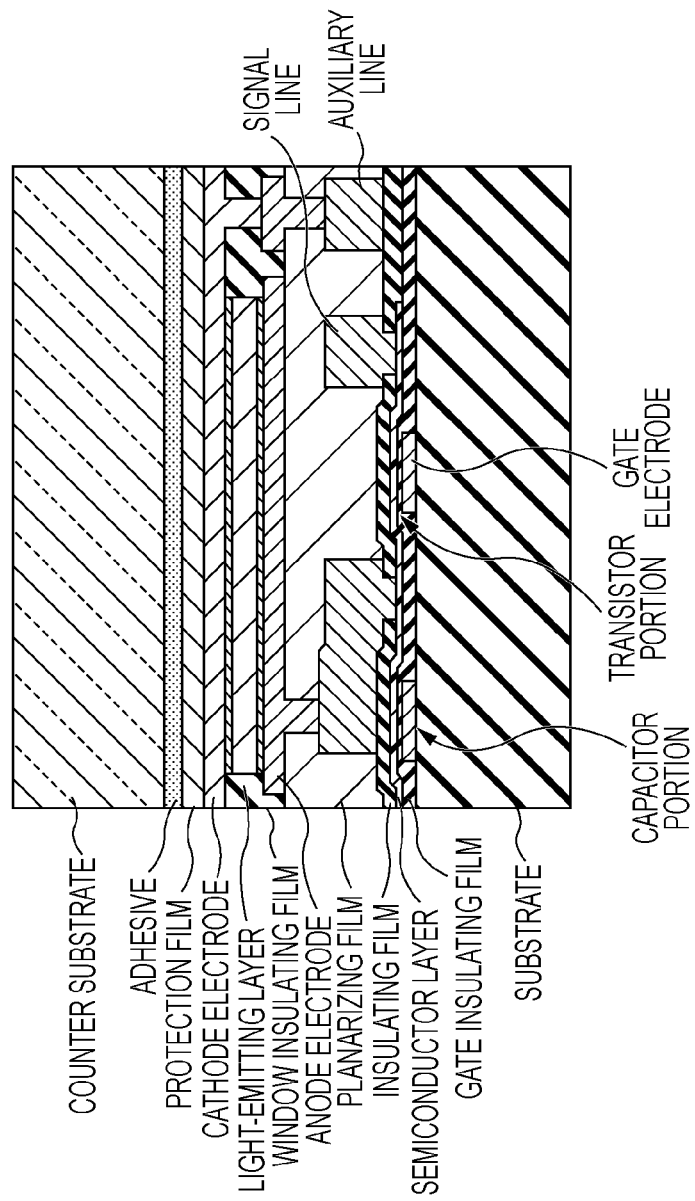
FIG. 14 is a cross-sectional view illustrating a device configuration of a display device according to an embodiment of the present invention.

A display device according to an embodiment of the present invention includes a thin-film device configuration illustrated in FIG. 14. FIG. 14 is a schematic cross-sectional view of a pixel formed on an insulating substrate. As illustrated in FIG. 14, a pixel includes a transistor portion including a plurality of thin-film transistors (in this drawing, only a single TFT is illustrated), a capacitor portion such as a storage capacitor, and a light-emitting portion such as an organic EL element. On the insulating substrate, the transistor portion and the capacitor portion are formed by performing a TFT process. On the transistor portion and the capacitor portion, the light-emitting portion such as an organic EL element is formed. A transparent counter substrate is attached on the light-emitting portion using an adhesive. Thus, a flat panel is created.

Figure 15:
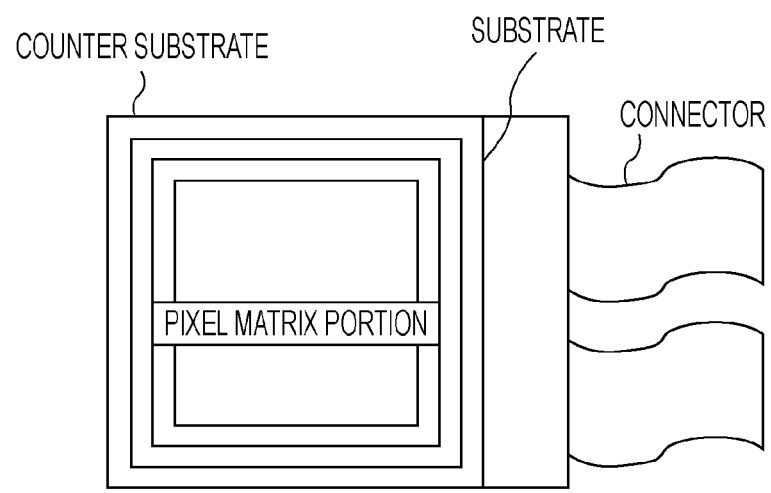
FIG. 15 is a plan view illustrating a module configuration of a display device according to an embodiment of the present invention.

As illustrated in FIG. 15, a display device according to an embodiment of the present invention may be a modular flat display device. For example, on an insulating substrate, a pixel array portion in which a plurality of pixels is arranged in a matrix form is formed. Each of the pixels includes an organic EL element, a thin-film transistor, and a thin-film capacitor. An adhesive is applied around this pixel array portion (pixel matrix portion), and a counter substrate such as a glass substrate is attached to the pixel array portion. Thus, a display module is created. A color filter, a protection film, a lightproof film, etc. may be attached to this transparent counter substrate as appropriate. The display module may be provided with an FPC (flexible printed circuit) as a connector for externally transmitting or outputting a signal to or from the pixel array portion.

The above-described display device according to an embodiment of the present invention is a flat panel display device, and can be applied to displays of various types of electronic apparatuses such as a digital camera, a notebook-sized personal computer, a mobile telephone, and a video camera for displaying a video signal that has been received thereby or been generated therein as an image or a picture. In the following, an exemplary electronic apparatus employing such a display device will be described.

Figure 16:
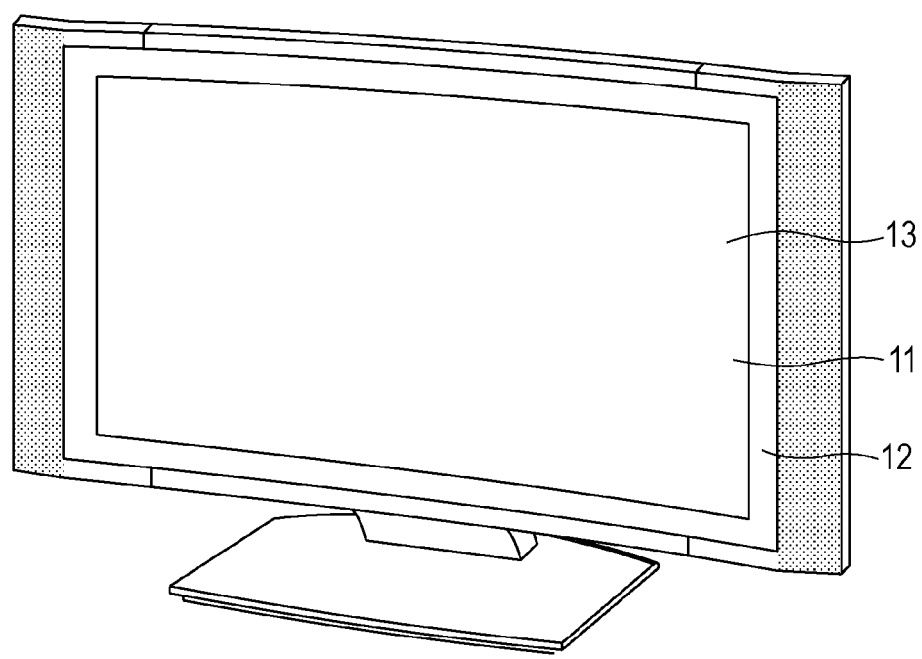
FIG. 16 is a perspective view of a television set including a display device according to an embodiment of the present invention.

FIG. 16 illustrates a television set employing a display device according to an embodiment of the present invention. The television set includes a picture display screen 11 composed of a front panel 12 and a filter glass 13. The television set is produced by applying a display device according to an embodiment of the present invention to the picture display screen 11.

Figure 17:
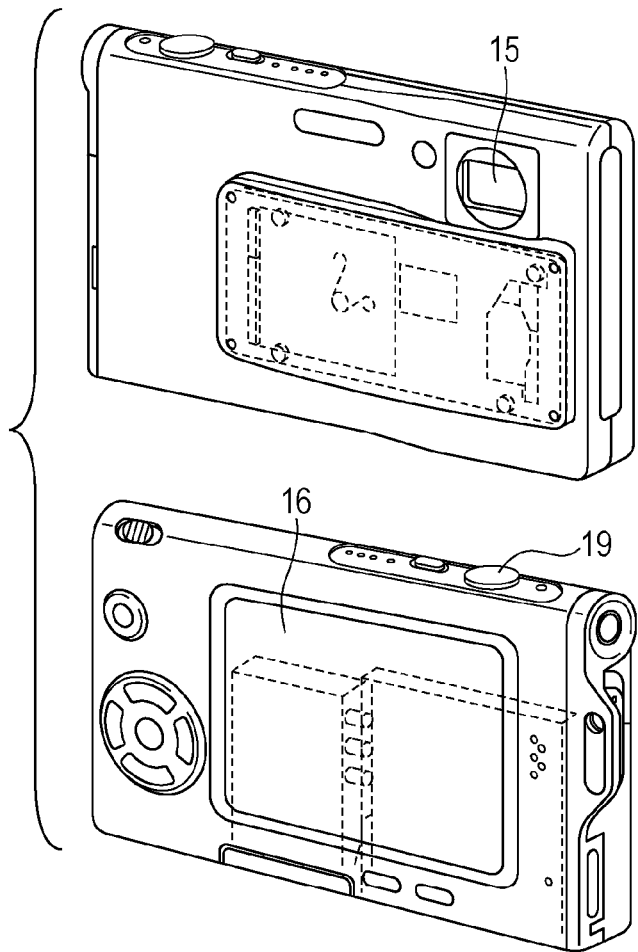
FIG. 17 is a perspective view of a digital still camera including a display device according to an embodiment of the present invention.

FIG. 17 illustrates a digital camera employing a display device according to an embodiment of the present invention. In FIG. 17, the upper diagram is a front view of the digital camera and the lower diagram is a rear view of the digital camera. This digital camera includes a shooting lens, a light-emitting portion 15 used for firing of a flash, a display portion 16, a control switch, a menu switch, and a shutter 19. This digital camera is produced by applying a display device according to an embodiment of the present invention to the display portion 16.

Figure 18:
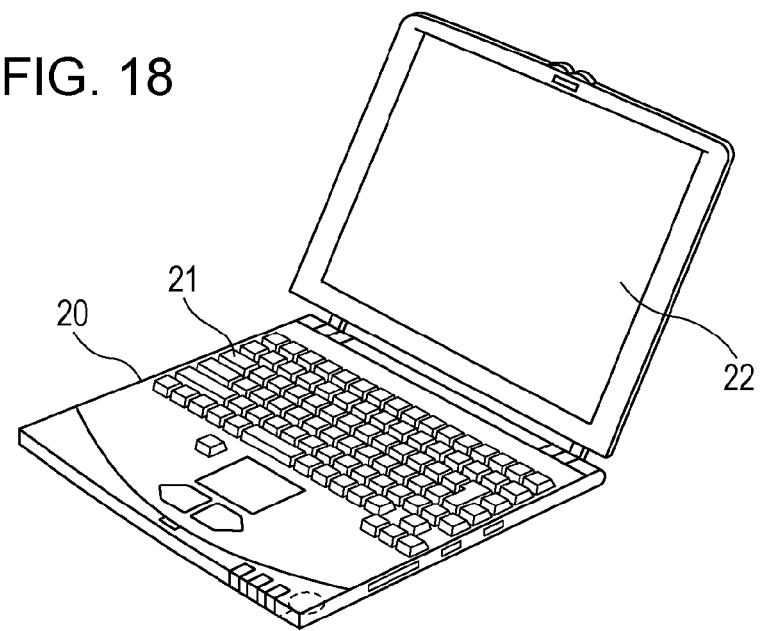
FIG. 18 is a perspective view of a notebook-sized personal computer including a display device according to an embodiment of the present invention.

FIG. 18 illustrates a notebook-sized personal computer employing a display device according to an embodiment of the present invention. A body 20 includes a keyboard 21 used to input a character, and the cover for the body 20 includes a display portion 22 used for image display. This notebook-sized personal computer is produced by applying a display device according to an embodiment of the present invention to the display portion 22.

Figure 19:
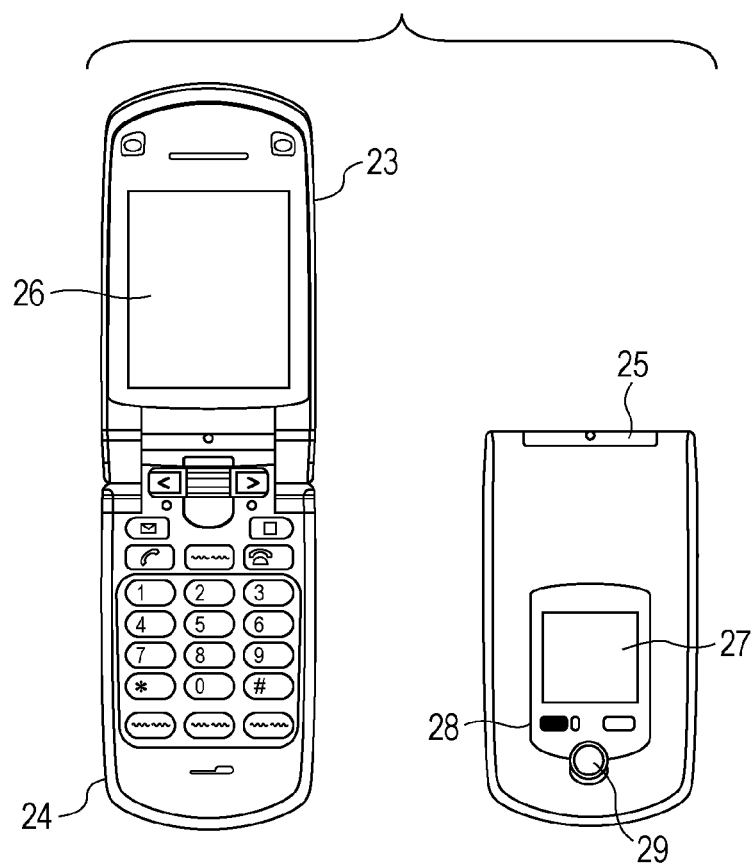
FIG. 19 is a schematic diagram of a mobile terminal device including a display device according to an embodiment of the present invention.

FIG. 19 illustrates a mobile terminal device employing a display device according to an embodiment of the present invention. In FIG. 19, the left diagram illustrates an open state and the right diagram illustrates a closed state. This mobile terminal device includes an upper housing 23, a lower housing 24, a connecting portion (hinge portion) 25, a display 26, a sub-display 27, a picture light 28, and a camera 29. This mobile terminal device is produced by applying a display device according to an embodiment of the present invention to the display 26 and the sub-display 27.

Figure 20:
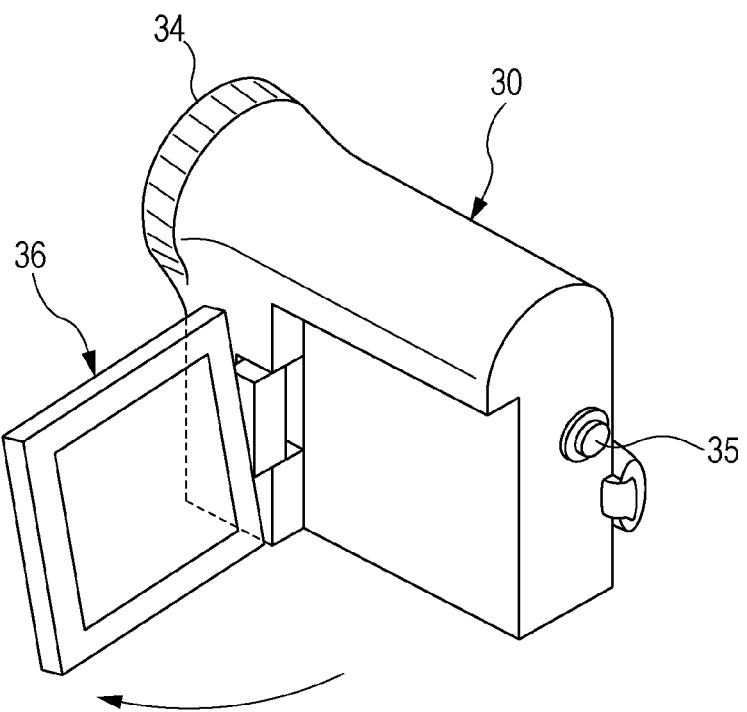
FIG. 20 is a perspective view of a video camera including a display device according to an embodiment of the present invention.

FIG. 20 illustrates a video camera employing a display device according to an embodiment of the present invention. This video camera includes a body 30, a photographing lens 34 disposed on the front side, a photographing start/stop switch 35, and a monitor 36. This video camera is produced by applying a display device according to an embodiment of the present invention to the monitor 36.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel array portion; and
a driving portion configured to drive the pixel array portion,
the pixel array portion including row scanning lines, column signal lines, and pixels arranged in a matrix form, the driving portion including at least a write scanner configured to supply a control signal to each of the row scanning lines and a signal selector configured to supply a video signal and a predetermined potential to each of the column signal lines,
each of the pixels comprising:
a storage capacitor;
a light-emitting element;
a first transistor configured to be turned on in response to the control signal and to supply the video signal from one of the column signal lines to the storage capacitor; and
a second transistor configured to supply a driving current to the light-emitting element depending on the video signal stored in the storage capacitor,
wherein the storage capacitor is connected to a control terminal of the second transistor, and
wherein the first transistor is configured to obtain the predetermined potential from one of the column signal lines in response to the control signal supplied from the write scanner and to apply the predetermined potential to the control terminal of the second transistor to switch to a non-light-emission period from a light-emission period, and
wherein the first transistor is configured to be turned on at a beginning of the non-light emission period, to be turned off before a threshold correction period, to be turned on again at a beginning of a signal writing period and to be turned off again at a beginning of the light-emission period.

2. The display device according to claim 1, wherein the storage capacitor is connected between the control terminal of the second transistor and a current terminal of the second transistor in each of the pixels.

3. The display device according to claim 2, wherein each of the pixels is configured to correct a threshold voltage of the second transistor by passing a current to the second transistor until the second transistor is cut off before the video signal is sampled, to obtain a voltage between the control terminal of the second transistor and the current terminal of the second transistor when the second transistor is cut off, and to store the voltage in the storage capacitor.

4. The display device according to claim 2, wherein each of the pixels is configured to correct a mobility of the second transistor by negatively feeding back the driving current flowing through the second transistor to the storage capacitor for a predetermined correction period when the first transistor is turned on and the video signal is stored in the storage capacitor.

* * * * *